(12) United States Patent
Silverbrook

(10) Patent No.: US 6,231,163 B1
(45) Date of Patent: May 15, 2001

(54) STACKED ELECTROSTATIC INK JET PRINTING MECHANISM

(75) Inventor: Kia Silverbrook, Sydney (AU)

(73) Assignee: Silverbrook Research Pty Ltd, Balmain (AU)

(*) Notice: Subject to any disclaimer, the term of this patent is extended or adjusted under 35 U.S.C. 154(b) by 0 days.

(21) Appl. No.: 09/112,803

(22) Filed: Jul. 10, 1998

(30) Foreign Application Priority Data

Jul. 15, 1997 (AU) .................................................. PO7991
Jul. 15, 1997 (AU) .................................................. PO8071

(51) Int. Cl.[7] .............................. B41J 2/015; B41J 2/135; B41J 2/04; B41J 2/14; B41J 2/045

(52) U.S. Cl. ................................. 347/54; 347/20; 347/44; 347/47; 347/71

(58) Field of Search ................................. 347/44, 54, 20, 347/47, 68, 71

(56) References Cited

U.S. PATENT DOCUMENTS 4,520,375 * 5/1985 Kroll ...................................... 347/54

* cited by examiner

Primary Examiner—John Barlow
Assistant Examiner—An H. Do

(57) ABSTRACT

This patent describes an ink jet printer utilizing a stacked capacitor arrangement to actuate the ejection of ink from a nozzle chamber. The stacked capacitor includes a series of conductive parallel plates interleaved with a resiliently compressible material. A potential difference is produced across the plates so as to attract adjacent plates to one another thereby causing the compressible material to resiliently yield. The compression results in ink being drawn into the nozzle chamber by means of surface tension effects around the ink ejection port. The potential difference is then reduced such that the compressible material returns to its quiescent state, thereby resulting in the ejection of ink. The compressible material preferably includes a material having a high dielectric constant and constructed utilizing semiconductor fabrication techniques by laying down one planar layer at a time constructed utilizing chemical vapor deposition techniques so as to form an initial sandwiched preform and subsequently selectively etching the preform so as to provide for an electrical interconnect to the conductive parallel plates.

9 Claims, 9 Drawing Sheets

STACKED ELECTROSTATIC INK JET PRINTING MECHANISM

CROSS REFERENCES TO RELATED APPLICATIONS

The following Australian provisional patent applications are hereby incorporated by cross-reference. For the purposes of location and identification, U.S. patent applications identified by their U.S. patent application serial numbers (U.S.S.N.) are listed alongside the Australian applications from which the U.S. patent applications claim the right of priority.

| CROSS-REFERENCED AUSTRALIAN PROVISIONAL PATENT NO. | US PATENT APPLICATION (CLAIMING RIGHT OF PRIORITY FROM AUSTRALIAN PROVISIONAL APPLICATION) | DOCKET NO. |
|---|---|---|
| PO7991 | 09/113,060 | ART01 |
| PO8505 | 09/113,070 | ART02 |
| PO7988 | 09/113,073 | ART03 |
| PO9395 | 09/112,748 | ART04 |
| PO8017 | 09/112,747 | ART06 |
| PO8014 | 09/112,776 | ART07 |
| PO8025 | 09/112,750 | ART08 |
| PO8032 | 09/112,746 | ART09 |
| PO7999 | 09/112,743 | ART10 |
| PO7998 | 09/112,742 | ART11 |
| PO8031 | 09/112,741 | ART12 |
| PO8030 | 09/112,740 | ART13 |
| PO7997 | 09/112,739 | ART15 |
| PO7979 | 09/113,053 | ART16 |
| PO8015 | 09/112,738 | ART17 |
| PO7978 | 09/113,067 | ART18 |
| PO7982 | 09/113,063 | ART19 |
| PO7989 | 09/113,069 | ART20 |
| PO8019 | 09/112,744 | ART21 |
| PO7980 | 09/113,058 | ART22 |
| PO8018 | 09/112,777 | ART24 |
| PO7938 | 09/113,224 | ART25 |
| PO8016 | 09/112,804 | ART26 |
| PO8024 | 09/112,805 | ART27 |
| PO7940 | 09/113,072 | ART28 |
| PO7939 | 09/112,785 | ART29 |
| PO8501 | 09/112,797 | ART30 |
| PO8500 | 09/112,796 | ART31 |
| PO7987 | 09/113,071 | ART32 |
| PO8022 | 09/112,824 | ART33 |
| PO8497 | 09/113,090 | ART34 |
| PO8020 | 09/112,823 | ART38 |
| PO8023 | 09/113,222 | ART39 |
| PO8504 | 09/112,786 | ART42 |
| PO8000 | 09/113,051 | ART43 |
| PO7977 | 09/112,782 | ART44 |
| PO7934 | 09/113,056 | ART45 |
| PO7990 | 09/113,059 | ART46 |
| PO8499 | 09/113,091 | ART47 |
| PO8502 | 09/112,753 | ART48 |
| PO7981 | 09/113,055 | ART50 |
| PO7986 | 09/113,057 | ART51 |
| PO7983 | 09/113,054 | ART52 |
| PO8026 | 09/112,752 | ART53 |
| PO8027 | 09/112,759 | ART54 |
| PO8028 | 09/112,757 | ART56 |
| PO9394 | 09/112,758 | ART57 |
| PO9396 | 09/113,107 | ART58 |
| PO9397 | 09/112,829 | ART59 |
| PO9398 | 09/112,792 | ART60 |
| PO9399 | 09/112,791 | ART61 |
| PO9400 | 09/112,790 | ART62 |
| PO9401 | 09/112,789 | ART63 |
| PO9402 | 09/112,788 | ART64 |
| PO9403 | 09/112,795 | ART65 |
| PO9405 | 09/112,749 | ART66 |
| PP0959 | 09/112,784 | ART68 |
| PP1397 | 09/112,783 | ART69 |
| PP2370 | 09/112,781 | DOT01 |
| PP2371 | 09/113,052 | DOT02 |
| PO8003 | 09/112,834 | Fluid01 |
| PO8005 | 09/113,103 | Fluid02 |
| PO9404 | 09/113,101 | Fluid03 |
| PO8066 | 09/112,751 | IJ01 |
| PO8072 | 09/112,787 | IJ02 |
| PO8040 | 09/112,802 | IJ03 |
| PO8071 | 09/112,803 | IJ04 |
| PO8047 | 09/113,097 | IJ05 |
| PO8035 | 09/113,099 | IJ06 |
| PO8044 | 09/113,084 | IJ07 |
| PO8063 | 09/113,066 | IJ08 |
| PO8057 | 09/112,778 | IJ09 |
| PO8056 | 09/112,779 | IJ10 |
| PO8069 | 09/113,077 | IJ11 |
| PO8049 | 09/113,061 | IJ12 |
| PO8036 | 09/112,818 | IJ13 |
| PO8048 | 09/112,816 | IJ14 |
| PO8070 | 09/112,772 | IJ15 |
| PO8067 | 09/112,819 | IJ16 |
| PO8001 | 09/112,815 | IJ17 |
| PO8038 | 09/113,096 | IJ18 |
| PO8033 | 09/113,068 | IJ19 |
| PO8002 | 09/113,095 | IJ20 |
| PO8068 | 09/112,808 | IJ21 |
| PO8062 | 09/112,809 | IJ22 |
| PO8034 | 09/112,780 | IJ23 |
| PO8039 | 09/113,083 | IJ24 |
| PO8041 | 09/113,121 | IJ25 |
| PO8004 | 09/113,122 | IJ26 |
| PO8037 | 09/112,793 | IJ27 |
| PO8043 | 09/112,794 | IJ28 |
| PO8042 | 09/113,128 | IJ29 |
| PO8064 | 09/113,127 | IJ30 |
| PO9389 | 09/112,756 | IJ31 |
| PO9391 | 09/112,755 | IJ32 |
| PP0888 | 09/112,754 | IJ33 |
| PP0891 | 09/112,811 | IJ34 |
| PP0890 | 09/112,812 | IJ35 |
| PP0873 | 09/112,813 | IJ36 |
| PP0993 | 09/112,814 | IJ37 |
| PP0890 | 09/112,764 | IJ38 |
| PP1398 | 09/112,765 | IJ39 |
| PP2592 | 09/112,767 | IJ40 |
| PP2593 | 09/112,768 | IJ41 |
| PP3991 | 09/112,807 | IJ42 |
| PP3987 | 09/112,806 | IJ43 |
| PP3985 | 09/112,820 | IJ44 |
| PP3983 | 09/112,821 | IJ45 |
| PO7935 | 09/112,822 | IJM01 |
| PO7936 | 09/112,825 | IJM02 |
| PO7937 | 09/112,826 | IJM03 |
| PO8061 | 09/112,827 | IJM04 |
| PO8054 | 09/112,828 | IJM05 |
| PO8065 | 09/113,111 | IJM06 |
| PO8055 | 09/113,108 | IJM07 |
| PO8053 | 09/113,109 | IJM08 |
| PO8078 | 09/113,123 | IJM09 |
| PO7933 | 09/113,114 | IJM10 |
| PO7950 | 09/113,115 | IJM11 |
| PO7949 | 09/113,129 | IJM12 |
| PO8060 | 09/113,124 | IJM13 |
| PO8059 | 09/113,125 | IJM14 |
| PO8073 | 09/113,126 | IJM15 |
| PO8076 | 09/113,119 | IJM16 |
| PO8075 | 09/113,120 | IJM17 |
| PO8079 | 09/113,221 | IJM18 |
| PO8050 | 09/113,116 | IJM19 |
| PO8052 | 09/113,118 | IJM20 |
| PO7948 | 09/113,117 | IJM21 |
| PO7951 | 09/113,113 | IJM22 |
| PO8074 | 09/113,130 | IJM23 |
| PO7941 | 09/113,110 | IJM24 |

-continued

| CROSS-REFERENCED AUSTRALIAN PROVISIONAL PATENT NO. | US PATENT APPLICATION (CLAIMING RIGHT OF PRIORITY FROM AUSTRALIAN PROVISIONAL APPLICATION) NO. | DOCKET NO. |
|---|---|---|
| PO8077 | 09/113,112 | IJM25 |
| PO8058 | 09/113,087 | IJM26 |
| PO8051 | 09/113,074 | IJM27 |
| PO8045 | 09/113,089 | IJM28 |
| PO7952 | 09/113,088 | IJM29 |
| PO8046 | 09/112,771 | IJM30 |
| PO9390 | 09/112,769 | IJM31 |
| PO9392 | 09/112,770 | IJM32 |
| PP0889 | 09/112,798 | IJM35 |
| PP0887 | 09/112,801 | IJM36 |
| PP0882 | 09/112,800 | IJM37 |
| PP0874 | 09/112,799 | IJM38 |
| PP1396 | 09/113,098 | IJM39 |
| PP3989 | 09/112,833 | IJM40 |
| PP2591 | 09/112,832 | IJM41 |
| PP3990 | 09/112,831 | IJM42 |
| PP3986 | 09/112,830 | IJM43 |
| PP3984 | 09/112,836 | IJM44 |
| PP3982 | 09/112,835 | IJM45 |
| PP0895 | 09/113,102 | IR01 |
| PP0870 | 09/113,106 | IR02 |
| PP0869 | 09/113,105 | IR04 |
| PP0887 | 09/113,104 | IR05 |
| PP0885 | 09/112,810 | IR06 |
| PP0884 | 09/112,766 | IR10 |
| PP0886 | 09/113,085 | IR12 |
| PP0871 | 09/113,086 | IR13 |
| PP0876 | 09/113,094 | IR14 |
| PP0877 | 09/112,760 | IR16 |
| PP0878 | 09/112,773 | IR17 |
| PP0879 | 09/112,774 | IR18 |
| PP0883 | 09/112,775 | IR19 |
| PP0880 | 09/112,745 | IR20 |
| PP0881 | 09/113,092 | 1R21 |
| PO8006 | 09/113,100 | MEMS02 |
| PO8007 | 09/113,093 | MEMS03 |
| PO8008 | 09/113,062 | MEMS04 |
| PO8010 | 09/113,064 | MEMS05 |
| PO8011 | 09/113,082 | MEMS06 |
| PO7947 | 09/113,081 | MEMS07 |
| PO7944 | 09/113,080 | MEMS09 |
| PO7946 | 09/113,079 | MEMS10 |
| PO9393 | 09/113,065 | MEMS11 |
| PP0875 | 09/113,078 | MEMS12 |
| PP0894 | 09/113,075 | MEMS13 |

STATEMENT REGARDING FEDERALLY SPONSORED RESEARCH OR DEVELOPMENT

Not applicable.

FIELD OF THE INVENTION

The present invention relates to ink jet printing and in particular discloses a stacked electrostatic ink jet printer.

The present invention further relates to the field of drop on demand ink jet printing.

BACKGROUND OF THE INVENTION

Many different types of printing have been invented, a large number of which are presently in use. The known forms of print have a variety of methods for marking the print media with a relevant marking media. Commonly used forms of printing include offset printing, laser printing and copying devices, dot matrix type impact printers, thermal paper printers, film recorders, thermal wax printers, dye sublimation printers and ink jet printers both of the drop on demand and continuous flow type. Each type of printer has its own advantages and problems when considering cost, speed, quality, reliability, simplicity of construction and operation etc.

In recent years, the field of ink jet printing, wherein each individual pixel of ink is derived from one or more ink nozzles has become increasingly popular primarily due to its inexpensive and versatile nature.

Many different techniques on ink jet printing have been invented. For a survey of the field, reference is made to an article by J Moore, "Non-Impact Printing: Introduction and Historical Perspective", Output Hard Copy Devices, Editors R Dubeck and S Sherr, pages 207–220 (1988).

Ink Jet printers themselves come in many different types. The utilization of a continuous stream ink in ink jet printing appears to date back to at least 1929 wherein U.S. Pat. No. 1,941,001 by Hansell discloses a simple form of continuous stream electro-static ink jet printing.

U.S. Pat. No. 3,596,275 by Sweet also discloses a process of a continuous ink jet printing including the step wherein the ink jet stream is modulated by a high frequency electrostatic field so as to cause drop separation. This technique is still utilized by several manufacturers including Elmjet and Scitex (see also U.S. Pat. No. 3,373,437 by Sweet et al)

Piezoelectric ink jet printers are also one form of commonly utilized ink jet printing device. Piezoelectric systems are disclosed by Kyser et. al. in U.S. Pat. No. 3,946,398 (1970) which utilizes a diaphragm mode of operation, by Zolten in U.S. Pat. No. 3,683,212 (1970) which discloses a squeeze mode of operation of a piezoelectric crystal, Stemme in U.S. Pat. No. 3,747,120 (1972) discloses a bend mode of piezoelectric operation, Howkins in U.S. Pat. No. 4,459,601 discloses a piezoelectric push mode actuation of the ink jet stream and Fischbeck in U.S. Pat. No. 4,584,590 which discloses a shear mode type of piezoelectric transducer element.

Recently, thermal ink jet printing has become an extremely popular form of ink jet printing. The ink jet printing techniques include those disclosed by Endo et al in GB 2007162 (1979) and Vaught et al in U.S. Pat. No. 4,490,728. Both the aforementioned references disclosed ink jet printing techniques rely upon the activation of an electrothermal actuator which results in the creation of a bubble in a constricted space, such as a nozzle, which thereby causes the ejection of ink from an aperture connected to the confined space onto a relevant print media. Printing devices utilizing the electrothermal actuator are manufactured by manufacturers such as Canon and Hewlett Packard.

As can be seen from the foregoing, many different types of printing technologies are available. Ideally, a printing technology should have a number of desirable attributes. These include inexpensive construction and operation, high speed operation, safe and continuous long term operation etc. Each technology may have its own advantages and disadvantages in the areas of cost, speed, quality, reliability, power usage, simplicity of construction operation, durability and consumables.

SUMMARY OF THE INVENTION

It is an object that the present invention provide an alternative form of drop on demand ink jet printing utilizing a stacked capacitor arrangement to actuate the ejection of ink from a nozzle chamber.

In accordance with the first aspect of the present invention there is provided an ink jet nozzle comprising a nozzle chamber having an ink ejection port in one wall of the chamber, an ink supply source interconnected to the nozzle chamber, an electrostatic actuator comprising a series of conductive parallel plates interleaved with a resiliently compressible material to eject ink from the nozzle chamber via the ejection port and a method comprising the steps of producing a potential difference across the plates so as to attract adjacent plates to one another and thereby causing the compressible material to resiliently yield and further reducing the potential difference such that the compressible material returns to its quiescent state, thereby resulting in the ejection of ink from the ejection port. The resilient yielding of the compressible material results in ink being drawn into the nozzle chamber by means of surface tension effects around the ink ejection port.

In accordance with a second aspect of the present invention, there is provided an ink jet nozzle comprising a nozzle chamber having an ink ejection port in one wall of the chamber, an ink supply source interconnected to the nozzle chamber, an electrostatic actuator, which comprises a series of conductive parallel plates interleaved with a resiliently compressible material, to eject ink from the nozzle chamber via the ink ejection port and a control means for producing a potential difference across the plates so that the material is resiliently, such that, upon deactivation, the electrostatic actuator causes ink to be ejected via the ink ejection port. Advantageously the compressible material comprises a material having a high dielectric constant, such material including piezo electric, electrostrictive or materials which can be switched between a ferro-electric and an anti-ferro-electric phase. Advantageously the electrostatic actuator is constructed utilizing semiconductor fabrication techniques by laying down one planar layer at a time so as to form an initial sandwiched preform, and subsequently selectively etching the preform so as to provide for an electrical interconnect to the conductive parallel plates. Further groups of the series of the conductive parallel plates are constructed from different materials so as to allow for the selective etching of the plates so as to divide them into 2 groups of different polarities during operation. The plates from each group are interconnected to a common conductive portion for the provision of a charge to the conductive plates. Advantageously, the plates are constructed utilizing chemical vapor deposition techniques. The outer surface of the nozzle chamber of the ink jet nozzle includes a plurality of etchant holes provided so as to allow a more rapid etching of sacrificial layers during construction.

BRIEF DESCRIPTION OF THE DRAWINGS

Notwithstanding any other forms which may fall within the scope of the present invention, preferred forms of the invention will now be described, by way of example only, with reference to the accompanying drawings, in which.

DESCRIPTION OF PREFERRED AND OTHER EMBODIMENTS

In the preferred embodiment, a stacked capacitive actuator is provided which has alternative electrode layers sandwiched between a compressible polymer. Hence, on activation of the stacked capacitor the plates are drawn together compressing the polymer thereby storing energy in the compressed polymer. The capacitor is then de-activated or drained with the result that the compressed polymer acts to return the actuator to its original position and thereby causes the ejection of ink from an ink ejection port.

Figure 1:
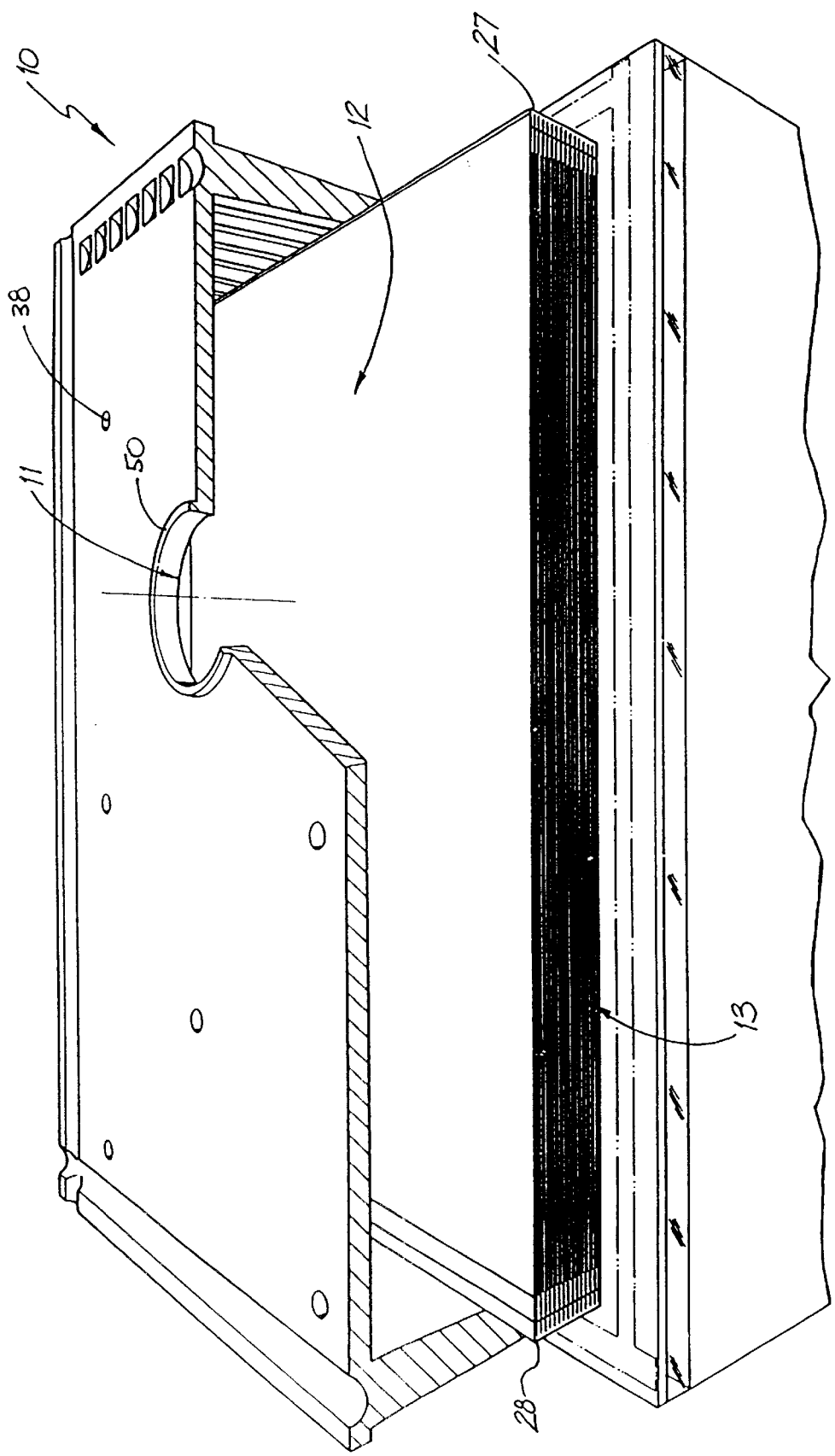
FIG. 1 is a perspective view through a single ink jet nozzle constructed in accordance with the preferred embodiment of the present invention.
Figure 2:
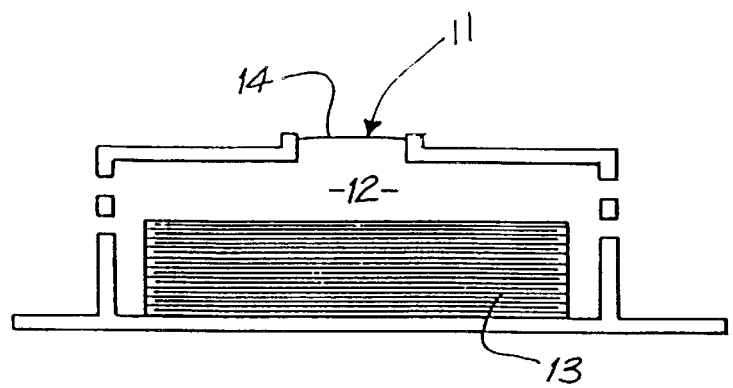
FIG. 2 is a schematic cross-sectional view of the ink nozzle constructed in accordance with the preferred embodiment of the present invention, with the actuator in its quiescent state.
Figure 3:
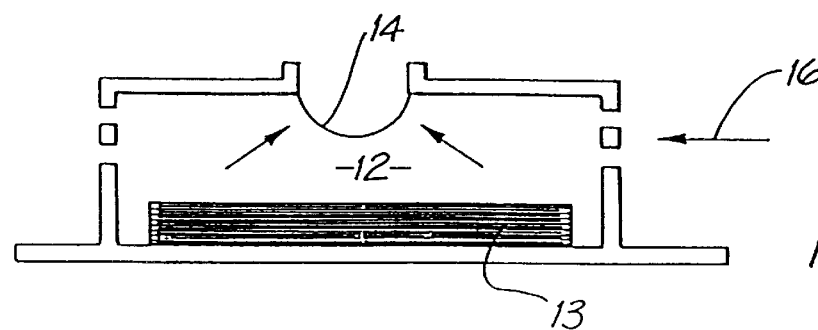
FIG. 3 is a schematic cross-sectional view of the ink nozzle immediately after activation of the actuator.

Turning now to FIG. 1, there is illustrated a single nozzle arrangement 10 as constructed in accordance with the preferred embodiment. The nozzle arrangement 10 includes an ink ejection portal 11 for the ejection of ink on demand. The ink is ejected from a nozzle chamber 12 by means of a stacked capacitor-type device 13. In a first design, the stacked capacitor device 13 consists of capacitive plates sandwiched between a compressible polymer. Upon charging of the capacitive plates, the polymer is compressed thereby resulting in a general "accordion" or "concertina-ing" of the actuator 13 so that its top surface moves away from the ink ejection portal 11. The compression of the polymer sandwich stores energy in the compressed polymer. The capacitors are subsequently rapidly discharged resulting in the energy in the compressed polymer being released upon the polymer's return to quiescent position. The return of the actuator to its quiescent position results in the ejection of ink from the nozzle chamber 12. The process is illustrated schematically in FIGS. 2–5 with FIG. 2 illustrating the nozzle chamber 10 in its quiescent or idle state, having an ink meniscus 14 around the nozzle ejection portal 11. Subsequently, the electrostatic actuator 13 is activated resulting in its contraction as indicated in FIG. 3. The contraction results in the meniscus 14 changing shape as indicated with the resulting surface tension effects resulting in the drawing in of ink around the meniscus and consequently ink 16 flows into nozzle chamber 12.

Figure 4:
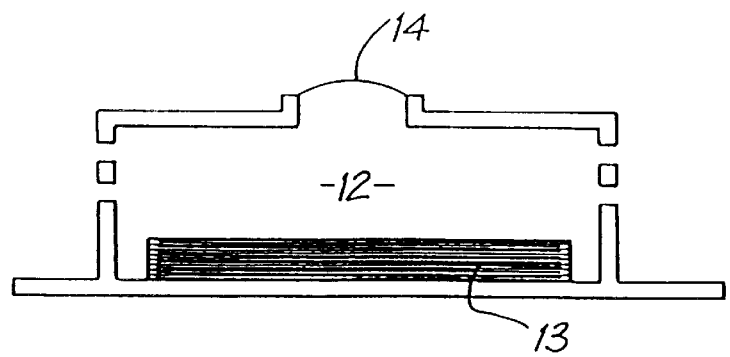
FIG. 4 is a schematic cross-sectional view illustrating the ink jet nozzle ready for firing.
Figure 5:
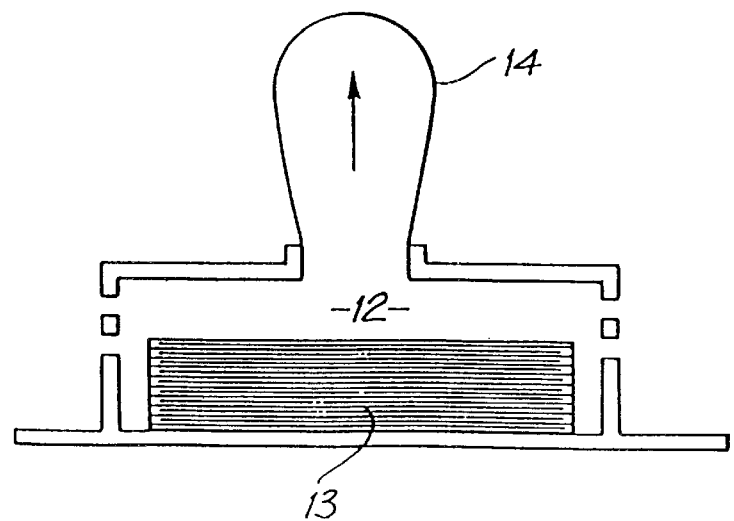
FIG. 5 is a schematic cross-sectional view of the ink nozzle immediately after deactivation of the actuator.

After sufficient time, the meniscus 14 returns to its quiescent position with the capacitor 13 being loaded ready for firing (FIG. 4). The capacitor plates 13 are then rapidly discharged resulting, as illustrated in FIG. 5, in the rapid return of the actuator 13 to its original position. The rapid return imparts a momentum to the ink within the nozzle chamber 12 so as to cause the expansion of the ink meniscus 14 and the subsequent ejection of ink from the nozzle chamber 12.

Figure 6:
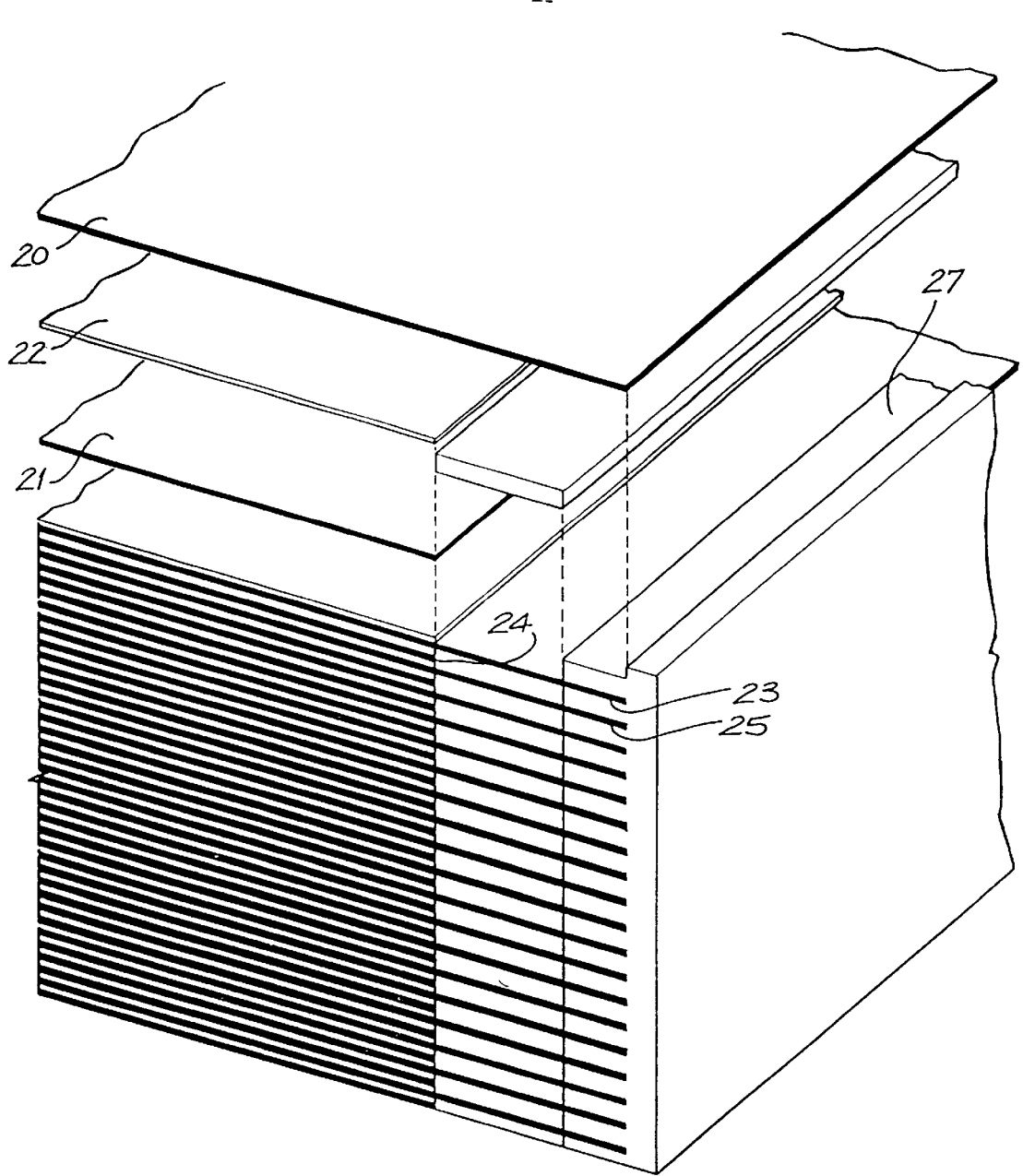
FIG. 6 is a perspective view, in part exploded, of the actuator of a single ink jet nozzle constructed in accordance with the preferred embodiment of the present invention.

Turning now to FIG. 6, there is illustrated a perspective view of a portion of the actuator 13 exploded in part. The actuator 13 consists of a series of interleaved plates 20, 21 between which is sandwiched a compressive material 22, for example styrene-ethylene-butylene-styrene block copolymer. One group of electrodes, e.g. 20, 23, 25 jut out at one side of the stacked capacitor layout. A second series of electrodes, e.g. 21, 24 jut out a second side of the capacitive actuator. The electrodes are connected at one side to a first conductive material 27 and the other series of electrodes, e.g. 21, 24 are connected to second conductive material 28 (FIG. 1). The two conductive materials 27, 28 are electrically isolated from one another and are in turn interconnected to lower signal and drive layers as will become more readily apparent hereinafter.

In alternative designs, the stacked capacitor device 13 consists of other thin film materials in place of the styrene-ethylene-butylene-styrene block copolymer. Such materials may include:

1) Piezoelectric materials such as PZT
2) Electrostrictive materials such as PLZT
3) Materials, that can be electrically switched between a ferro-electric and an anti-ferro-electric phase such as PLZSnT.

Importantly, the electrode actuator 13 can be rapidly constructed utilizing chemical vapor deposition (CVD) techniques. The various layers, 20, 21, 22 can be laid down on a planar wafer one after another covering the whole surface of the wafer. A stack can be built up rapidly utilizing CVD techniques. The two sets of electrodes are preferably deposited utilizing separate metals. For example, aluminum and tantalum could be utilized as materials for the metal layers. The utilization of different metal layers allows for selective etching utilizing a mask layer so as to form the structure as indicated in FIG. 6. For example, the CVD sandwich can be first laid down and then a series of selective etchings utilizing appropriate masks can be utilized to produce the overall stacked capacitor structure. The utilization of the CVD process substantially enhances the efficiency of production of the stacked capacitor devices.

Construction of the Ink Nozzle Arrangement

Figure 7:
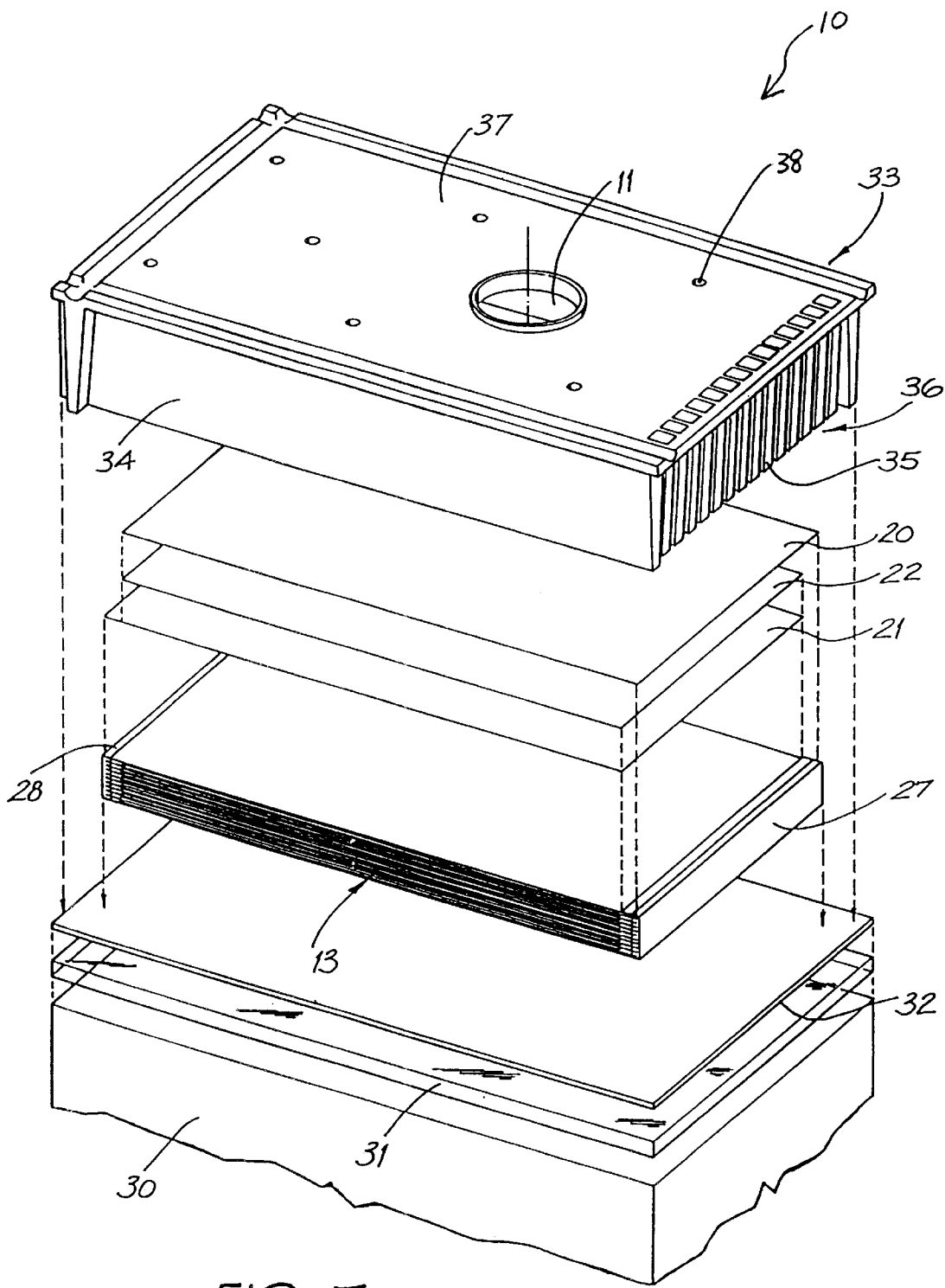
FIG. 7 is an exploded perspective view illustrating the construction of a single ink jet nozzle in accordance with the preferred embodiment of the present invention.

Turning now to FIG. 7 there is shown an exploded perspective view illustrating the construction of a single ink jet nozzle in accordance with the preferred embodiment. The ink jet nozzle arrangement 10 is constructed on a standard silicon wafer 30 on top of which is constructed data drive circuitry which can be constructed in the usual manner such as a two-level metal CMOS layer 31. On top of the CMOS layer 31 is constructed a nitride passivation layer 32 which provides passivation protection for the lower layers during operation and also should an etchant be utilized which would normally dissolve the lower layers. The various layers of the stacked device 13, for example 20, 21, 22, can be laid down utilizing CVD techniques. The stacked device 13 is constructed utilizing the aforementioned production steps including utilizing appropriate masks for selective etchings to produce the overall stacked capacitor structure. Further, interconnection can be provided between the electrodes 27, 28 and the circuitry in the CMOS layer 31. Finally, a nitride layer 33 is provided so as to form the walls of the nozzle chamber, e.g 34, and posts, e.g 35, in one open wall 36 of the nozzle chamber. The surface layer 37 of the layer 33 can be deposited onto a sacrificial material. The sacrificial material is subsequently etched so as to form the nozzle chamber 12 (FIG. 1). To this end, the top layer 37 includes etchant holes, e.g 38, so as to speed up the etching process in addition to the ink ejection portal 11. The diameter of the etchant holes, e.g 38, is significantly smaller than that of the ink ejection portal 11. If required an additional nitride layer may be provided on top of the layer 20 to protect the stacked device 13 during the etching of the sacrificial material to form the nozzle chamber 12 (FIG. 1) and during operation of the ink jet nozzle.

Figure 8:
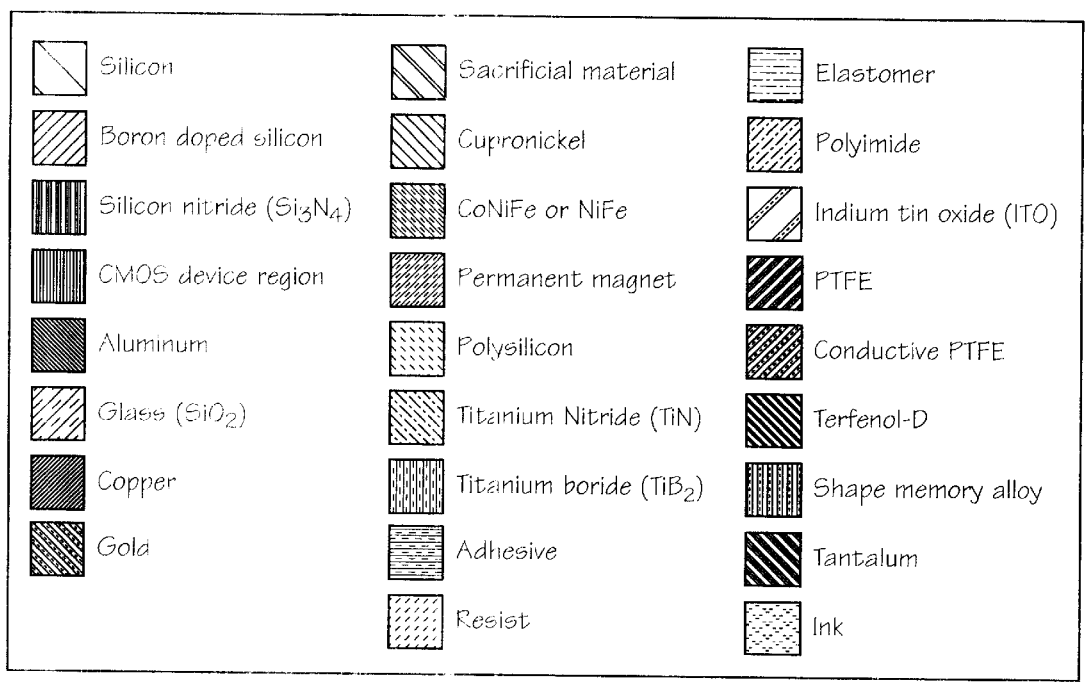
FIG. 8 provides a legend of the materials indicated in FIGS. 9 to 22.
Figure 9:
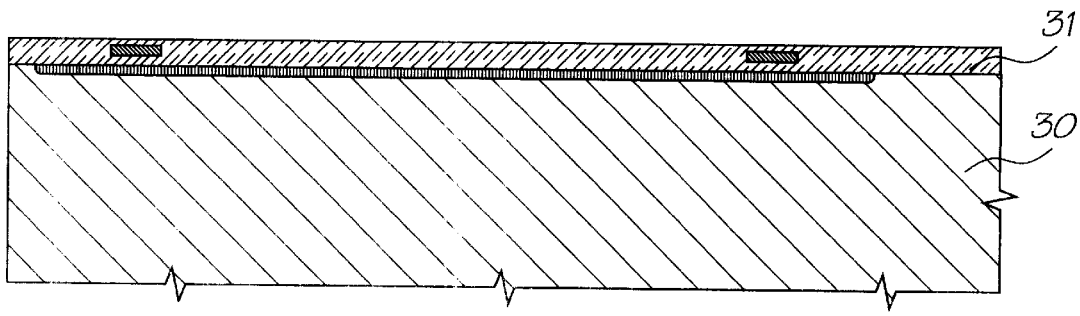
FIG. 9 to FIG. 22 illustrate sectional views of the manufacturing steps in one form of construction of an ink jet printhead nozzle.

One form of detailed manufacturing process which can be used to fabricate monolithic ink jet print heads operating in accordance with the principles taught by the present embodiment can proceed utilizing the following steps:

1. Using a double sided polished wafer 30, complete a 0.5 micron, one poly, 2 metal CMOS layer 31 process. This step is shown in FIG. 9. For clarity, these diagrams may not be to scale, and may not represent a cross section though any single plane of the nozzle. FIG. 8 is a key to representations of various materials in these manufacturing diagrams, and those of other cross referenced ink jet configurations.

2. Etch the CMOS oxide layers 31 to second level metal using Mask 1. This mask defines the contact vias from the electrostatic stack to the drive circuitry.

Figure 10:
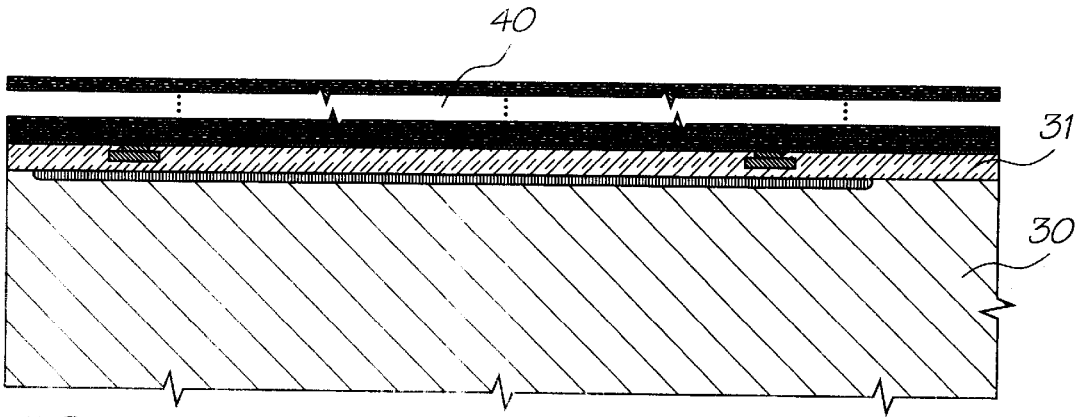
Figure 11:
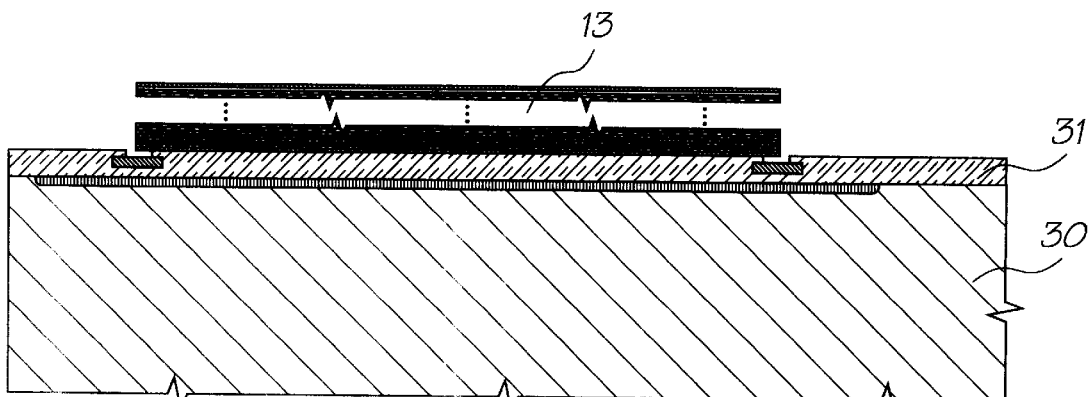
Figure 12:
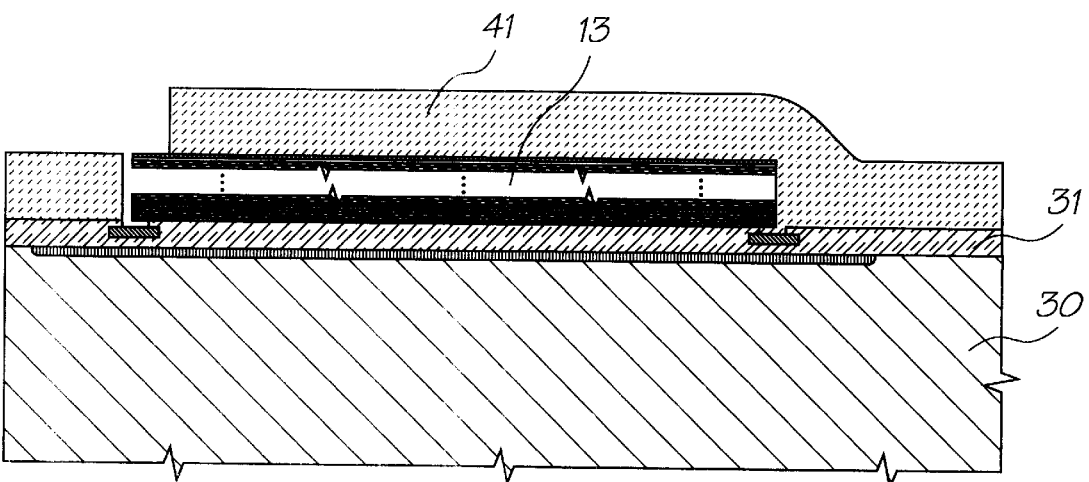
Figure 13:
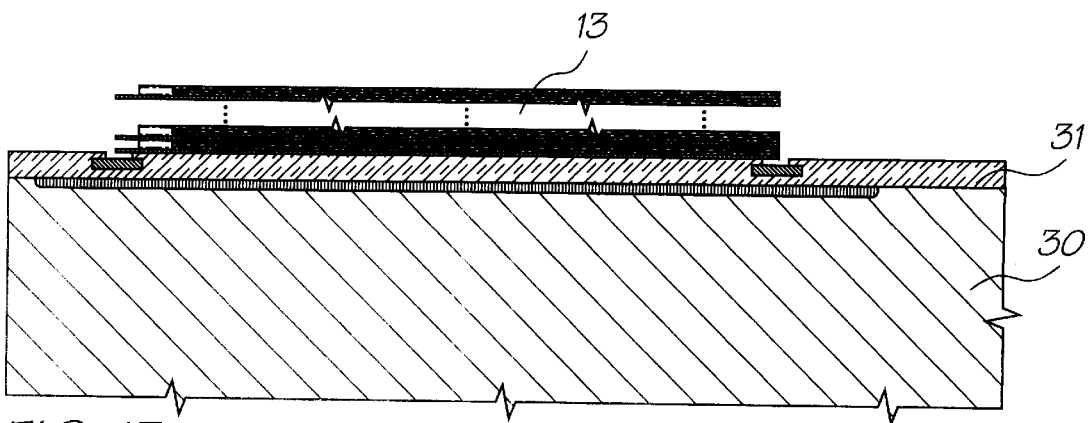
Figure 14:
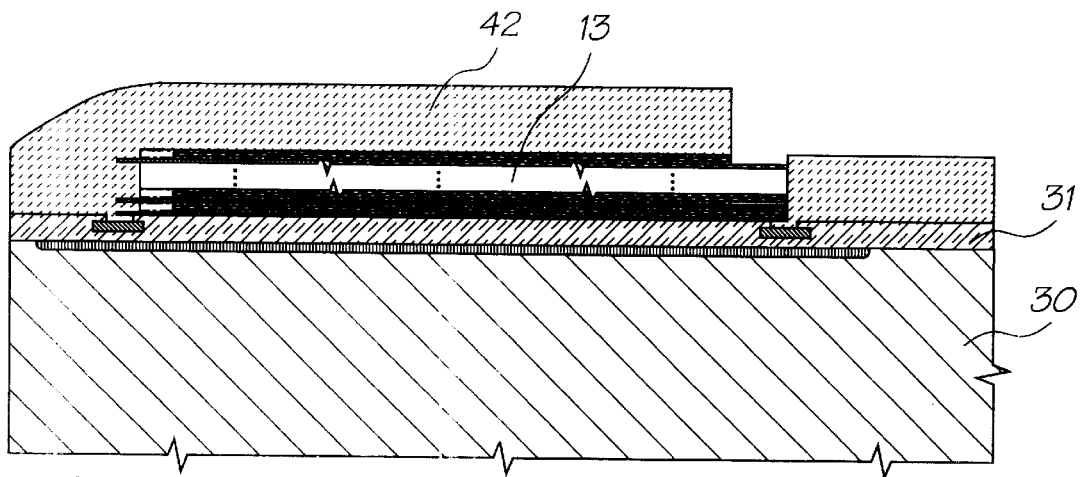
Figure 15:
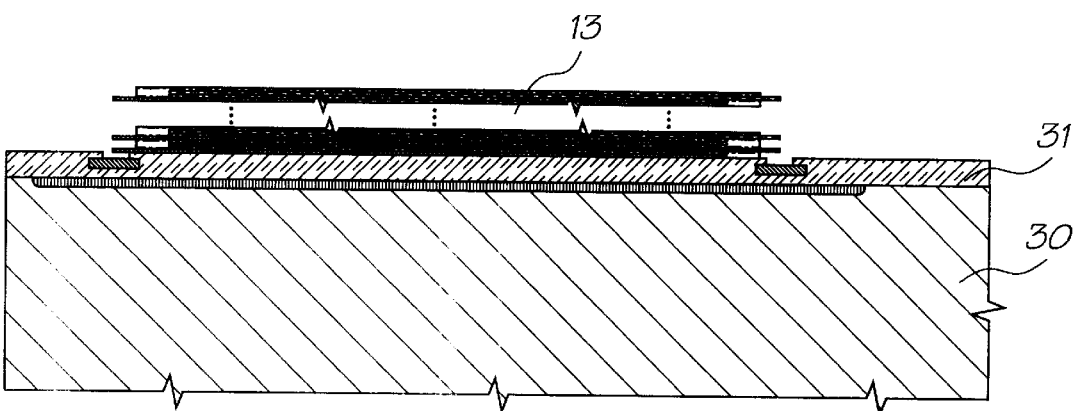
Figure 16:
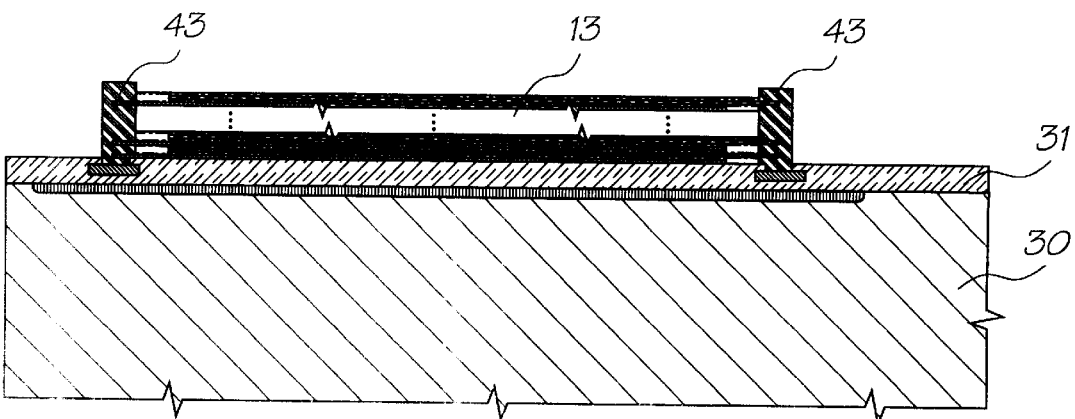
Figure 17:
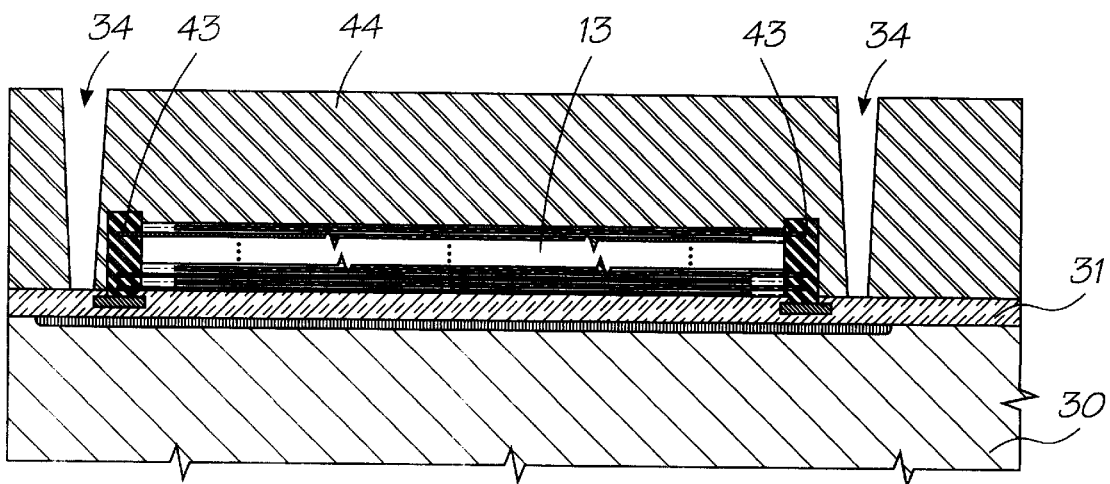
Figure 18:
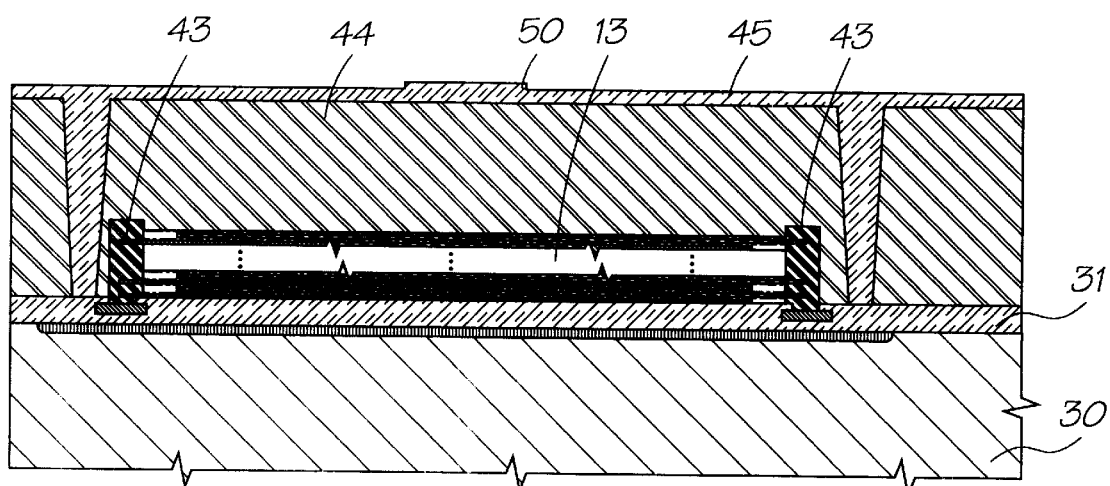
Figure 19:
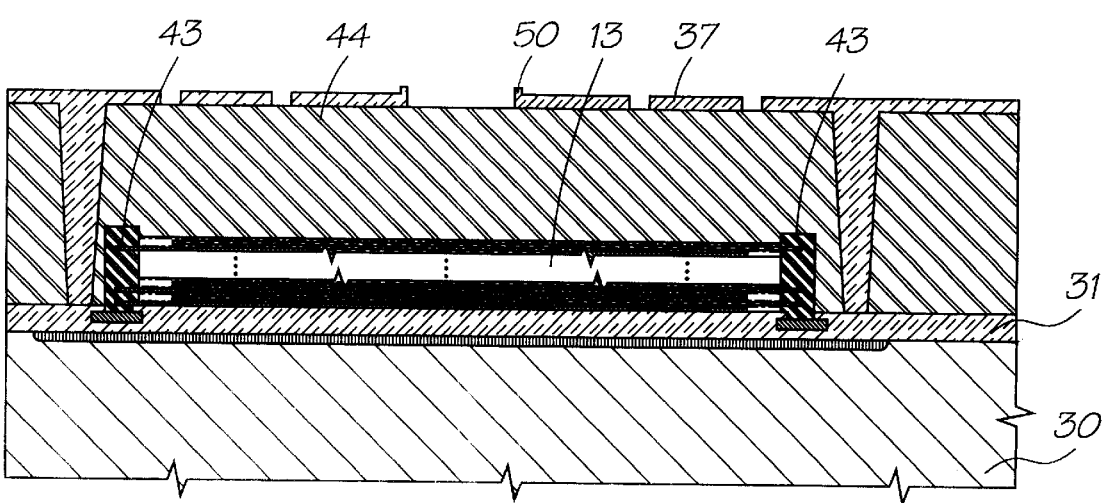
Figure 20:
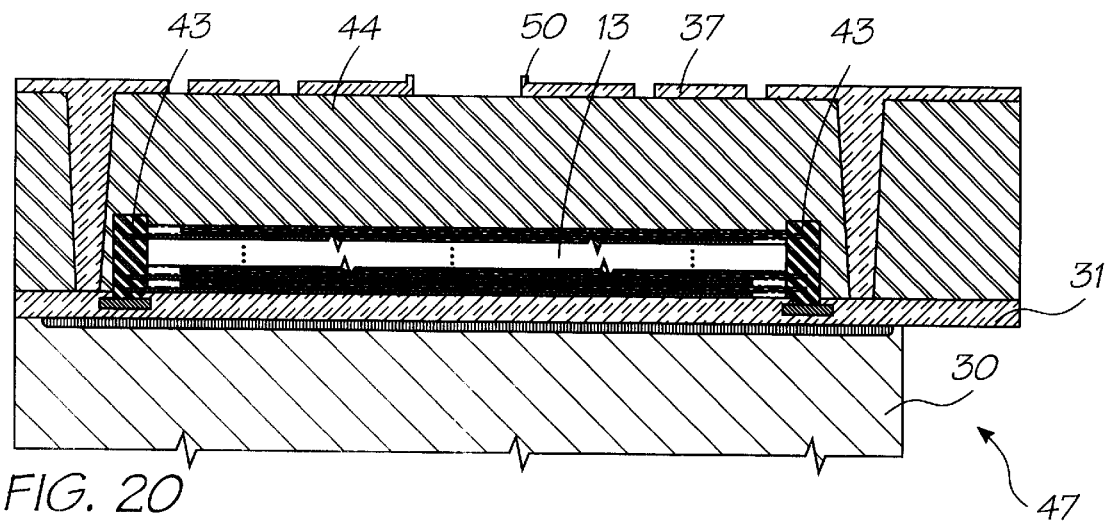
Figure 21:
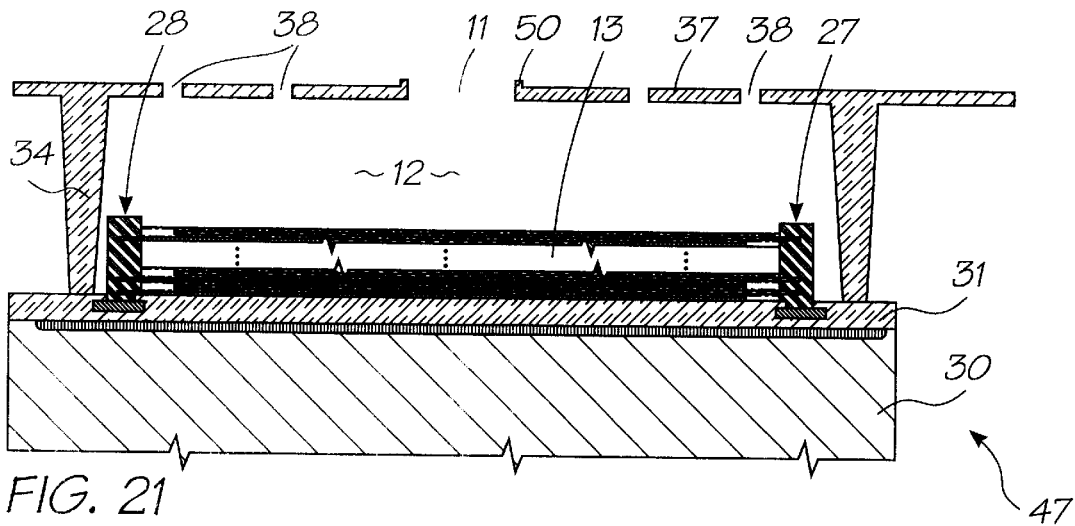

3. Deposit 0.1 microns of aluminum.
4. Deposit 0.1 microns of elastomer.
5. Deposit 0.1 microns of tantalum.
6. Deposit 0.1 microns of elastomer.
7. Repeat steps 2 to 5 twenty times to create a stack 40 of alternating metal and elastomer which is 8 microns high, with 40 metal layers and 40 elastomer layers. This step is shown in FIG. 10.
8. Etch the stack 40 using Mask 2. This leaves a separate rectangular multi-layer stack 13 for each nozzle. This step is shown in FIG. 11.
9. Spin on resist 41, expose with Mask 3, and develop. This mask defines one side of the stack 13. This step is shown in FIG. 12.
10. Etch the exposed elastomer layers to a horizontal depth of 1 micron.
11. Wet etch the exposed aluminum layers to a horizontal depth of 3 microns.
12. Foam the exposed elastomer layers by 50 nm to close the 0.1 micron gap left by the etched aluminum.
13. Strip the resist 41. This step is shown in FIG. 13.
14. Spin on resist 42, expose with Mask 4, and develop. This mask defines the opposite side of the stack 13. This step is shown in FIG. 14.
15. Etch the exposed elastomer layers to a horizontal depth of 1 micron.
16. Wet etch the exposed tantalum layers to a horizontal depth of 3 microns.
17. Foam the exposed elastomer layers by 50 nm to close the 0.1 micron gap left by the etched aluminum.
18. Strip the resist 42. This step is shown in FIG. 15.
19. Deposit 1.5 microns of tantalum 43. This metal contacts all of the aluminum layers on one side of the stack 13, and all of the tantalum layers on the other side of the stack 13.
20. Etch the tantalum 43 using Mask 5. This mask defines the electrodes at both edges of the stack 13. This step is shown in FIG. 16.
21. Deposit 18 microns of sacrificial material 44 (e.g. photosensitive polyimide).
22. Expose and develop the sacrificial layer 44 using Mask 6 using a proximity aligner. This mask defines the nozzle chamber walls and inlet filter. This step is shown in FIG. 17.
23. Deposit 3 microns of PECVD glass 45.
24. Etch to a depth of 1 micron using Mask 7. This mask defines the nozzle rim 50. This step is shown in FIG. 18.
25. Etch down to the sacrificial layer 44 using Mask 8. This mask defines the roof 37 of the nozzle chamber, and the nozzle 11 itself. This step is shown in FIG. 19.
26. Back-etch completely through the silicon wafer 30 (with, for example, an ASE Advanced Silicon Etcher from Surface Technology Systems) using Mask 9. This mask defines the ink inlets 47 which are etched through the wafer. The wafer is also diced by this etch. This step is shown in FIG. 20.
27. Back-etch through the CMOS oxide layer 31 through the holes in the wafer.
28. Etch the sacrificial material 44. The nozzle chambers are cleared, and the chips are separated by this etch. This step is shown in FIG. 21.

29. Mount the printheads in their packaging, which may be a molded plastic former incorporating ink channels which supply the appropriate color ink to the ink inlets at the back of the wafer.

30. Connect the printheads to their interconnect systems. For a low profile connection with minimum disruption of airflow, TAB may be used. Wire bonding may also be used if the printer is to be operated with sufficient clearance to the paper.

31. Hydrophobize the front surface of the printheads.

Figure 22:
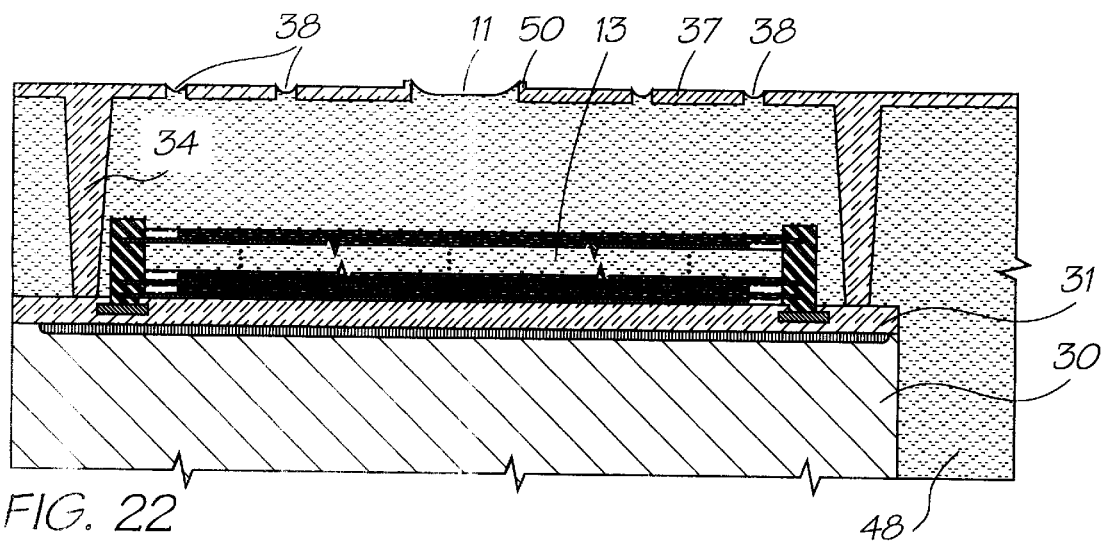

32. Fill the completed printheads with ink 48 and test them. A filled nozzle is shown in FIG. 22.

It would be appreciated by a person skilled in the art that numerous variations and/or modifications may be made to the present invention as shown in the preferred embodiment without departing from the spirit or scope of the invention as broadly described. The preferred embodiment is, therefore, to be considered in all respects to be illustrative and not restrictive.

The presently disclosed ink jet printing technology is potentially suited to a wide range of printing systems including: color and monochrome office printers, short run digital printers, high speed digital printers, offset press supplemental printers, low cost scanning printers, high speed pagewidth printers, notebook computers with in-built pagewidth printers, portable color and monochrome printers, color and monochrome copiers, color and monochrome facsimile machines, combined printer, facsimile and copying machines, label printers, large format plotters, photograph copiers, printers for digital photographic 'minilabs', video printers, PHOTO CD (PHOTO CD is a registered trade mark of the Eastman Kodak Company) printers, portable printers for PDAs, wallpaper printers, indoor sign printers, billboard printers, fabric printers, camera printers and fault tolerant commercial printer arrays.

Ink Jet Technologies

The embodiments of the invention use an ink jet printer type device. Of course many different devices could be used. However presently popular ink jet printing technologies are unlikely to be suitable.

The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per printhead, but is a major impediment to the fabrication of pagewidth printheads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

low power (less than 10 Watts)
high resolution capability (1,600 dpi or more)
photographic quality output
low manufacturing cost
small size (pagewidth times minimum cross section)
high speed (<2 seconds per page).

All of these features can be met or exceeded by the ink jet systems described below with differing levels of difficulty. Forty-five different ink jet technologies have been developed by the Assignee to give a wide range of choices for high volume manufacture. These technologies form part of separate applications assigned to the present Assignee as set out in the table under the heading Cross References to Related Applications.

The ink jet designs shown here are suitable for a wide range of digital printing systems, from battery powered one-time use digital cameras, through to desktop and network printers, and through to commercial printing systems.

For ease of manufacture using standard process equipment, the printhead is designed to be a monolithic 0.5 micron CMOS chip with MEMS post processing. For color photographic applications, the printhead is 100 mm long, with a width which depends upon the ink jet type. The smallest printhead designed is IJ38, which is 0.35 mm wide, giving a chip area of 35 square mm. The printheads each contain 19,200 nozzles plus data and control circuitry.

Ink is supplied to the back of the printhead by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The printhead is connected to the camera circuitry by tape automated bonding.

Tables of Drop-on-Demand Ink Jets

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.

Actuator mechanism (18 types)
Basic operation mode (7 types)
Auxiliary mechanism (8 types)
Actuator amplification or modification method (17 types)
Actuator motion (19 types)
Nozzle refill method (4 types)
Method of restricting back-flow through inlet (10 types)
Nozzle clearing method (9 types)
Nozzle plate construction (9 types)
Drop ejection direction (5 types)
Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. These are designated IJ01 to IJ45 above which matches the docket numbers in the table under the heading Cross References to Related Applications.

Other ink jet configurations can readily be derived from these forty-five examples by substituting alternative configurations along one or more of the 11 axes. Most of the IJ01 to IJ45 examples can be made into ink jet printheads with characteristics superior to any currently available ink jet technology.

Where there are prior art examples known to the inventor, one or more of these examples are listed in the examples column of the tables below. The IJO1 to IJ45 series are also listed in the examples column. In some cases, print technology may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

| | Description | Advantages | Disadvantages | Examples |
|---|---|---|---|---|
| | ACTUATOR MECHANISM (APPLIED ONLY TO SELECTED INK DROPS) | | | |
| Thermal bubble | An electrothermal heater heats the ink to above boiling point, transferring significant heat to the aqueous ink. A bubble nucleates and quickly forms, expelling the ink. The efficiency of the process is low, with typically less than 0.05% of the electrical energy being transformed into kinetic energy of the drop. | ◆ Large force generated<br>◆ Simple construction<br>◆ No moving parts<br>◆ Fast operation<br>◆ Small chip area required for actuator | ◆ High power<br>◆ Ink carrier limited to water<br>◆ Low efficiency<br>◆ High temperatures required<br>◆ High mechanical stress<br>◆ Unusual materials required<br>◆ Large drive transistors<br>◆ Cavitation causes actuator failure<br>◆ Kogation reduces bubble formation<br>◆ Large print heads are difficult to fabricate | ◆ Canon Bubblejet 1979 Endo et al GB patent 2,007,162<br>◆ Xerox heater-in-pit 1990 Hawkins et al U.S. Pat. No. 4,899,181<br>◆ Hewlett-Packard TIJ 1982 Vaught et al U.S. Pat. No. 4,490,728 |
| Piezo-electric | A piezoelectric crystal such as lead lanthanum zirconate (PZT) is electrically activated, and either expands, shears, or bends to apply pressure to the ink, ejecting drops. | ◆ Low power consumption<br>◆ Many ink types can be used<br>◆ Fast operation<br>◆ High efficiency | ◆ Very large area required for actuator<br>◆ Difficult to integrate with electronics<br>◆ High voltage drive transistors required<br>◆ Full pagewidth print heads impractical due to actuator size<br>◆ Requires electrical poling in high field strengths during manufacture | ◆ Kyser et al U.S. Pat. No. 3,946,398<br>◆ Zoltan U.S. Pat. No. 3,683,212<br>◆ 1973 Stemme U.S. Pat. No. 3,747,120<br>◆ Epson Stylus<br>◆ Tektronix<br>◆ IJ04 |
| Electro-strictive | An electric field is used to activate electrostriction in relaxor materials such as lead lanthanum zirconate titanate (PLZT) or lead magnesium niobate (PMN). | ◆ Low power consumption<br>◆ Many ink types can be used<br>◆ Low thermal expansion<br>◆ Electric field strength required (approx. 3.5 V/$\mu$m) can be generated without difficulty<br>◆ Does not require electrical poling | ◆ Low maximum strain (approx. 0.01%)<br>◆ Large area required for actuator due to low strain<br>◆ Response speed is marginal (~10 $\mu$s)<br>◆ High voltage drive transistors required<br>◆ Full pagewidth print heads impractical due to actuator size | ◆ Seiko Epson, Usui et al JP 253401/96<br>◆ IJ04 |
| Ferro-electric | An electric field is used to induce a phase transition between the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | ◆ Low power consumption<br>◆ Many ink types can be used<br>◆ Fast operation (<1 $\mu$s)<br>◆ Relatively high longitudinal strain<br>◆ High efficiency<br>◆ Electric field strength of around 3 V/$\mu$m can be readily provided | ◆ Difficult to integrate with electronics<br>◆ Unusual materials such as PLZSnT are required<br>◆ Actuators require a large area | ◆ IJ04 |
| Electro-static plates | Conductive plates are separated by a compressible or fluid | ◆ Low power consumption<br>◆ Many ink types | ◆ Difficult to operate electrostatic devices in an | ◆ IJ02, IJ04 |

-continued

| | Description | Advantages | Disadvantages | Examples |
|---|---|---|---|---|
| | dielectric (usually air). Upon application of a voltage, the plates attract each other and displace ink, causing drop ejection. The conductive plates may be in a comb or honeycomb structure, or stacked to increase the surface area and therefore the force. | can be used<br>♦ Fast operation | aqueous environment<br>♦ The electrostatic actuator will normally need to be separated from the ink<br>♦ Very large area required to achieve high forces<br>♦ High voltage drive transistors may be required<br>♦ full pagewidth print heads are not competitive due to actuator size | |
| Electro-static pull on ink | A strong electric field is applied to the ink, whereupon electrostatic attraction accelerates the ink towards the print medium. | ♦ Low current consumption<br>♦ Low temperature | ♦ High voltage required<br>♦ May be damaged by sparks due to air breakdown<br>♦ Required field strength increases as the drop size decreases<br>♦ High voltage drive transistors required<br>♦ Electrostatic field attracts dust | ♦ 1989 Saito et al, U.S. Pat. No. 4,799,068<br>♦ 1989 Miura et al, U.S. Pat. No. 4,810,954<br>♦ Tone-jet |
| Permanent magnet electro-magnetic | An electromagnet directly attracts a permanent magnet, displacing ink and causing drop ejection. Rare earth magnets with a field strength around 1 Tesla can be used. Examples are: Samarium Cobalt (SaCo) and magnetic materials in the neodymium iron boron family (NdFeB, NdDyFeBNb, NdDyFeB, etc) | ♦ Low power consumption<br>♦ Many ink types can be used<br>♦ Fast operation<br>♦ High efficiency<br>♦ Easy extension from single nozzles to pagewidth print heads | ♦ Complex fabrication<br>♦ Permanent magnetic material such as Neodymium Iron Boron (NdFeB) required.<br>♦ High local currents required<br>♦ Copper metalization should be used for long electromigration lifetime and low resistivity<br>♦ Pigmented inks are usually infeasible<br>♦ Operating temperature limited to the Curie temperature (around 540 K.) | ♦ IJ07, IJ10 |
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | ♦ Low power consumption<br>♦ Many ink types can be used<br>♦ Fast operation<br>♦ High efficiency<br>♦ Easy extension from single nozzles to pagewidth print heads<br>♦ | ♦ Complex fabrication<br>♦ Materials not usually present in a CMOS fab such as NiFe, CoNiFe, or CoFe are required<br>♦ High local currents required<br>♦ Copper metalization should be used for long electromigration lifetime and low resistivity<br>♦ Electroplating is required<br>♦ High saturation flux density is required (2.0–2.1 T is achievable with CoNiFe [1]) | ♦ IJ01, IJ05, IJ08, IJ10, IJ12, IJ14, IJ15, IJ17 |
| Lorenz force | The Lorenz force acting on a current carrying wire in a magnetic field is utilized. This allows the magnetic field to be | ♦ Low power consumption<br>♦ Many ink types can be used<br>♦ Fast operation<br>♦ High efficiency<br>♦ Easy extension | ♦ Force acts as a twisting motion<br>♦ Typically, only a quarter of the solenoid length provides force in a useful direction<br>♦ High local currents | ♦ IJ06, IJ11, IJ13, IJ16 |

-continued

| | Description | Advantages | Disadvantages | Examples |
|---|---|---|---|---|
| | supplied eternally to the print head, for example with rare earth permanent magnets. Only the current carrying wire need be fabricated on the print-head, simplifying materials requirements. | from single nozzles to pagewidth print heads | required<br>♦ Copper metalization should be used for long electromigration lifetime and low resistivity<br>♦ Pigmented inks are usually infeasible | |
| Magneto-striction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx. 8 MPa. | ♦ Many ink types can be used<br>♦ Fast operation<br>♦ Easy extension from single nozzles to pagewidth print heads<br>♦ High force is available | ♦ Force acts as a twisting motion<br>♦ Unusual materials such as Terfenol-D are required<br>♦ High local currents required<br>♦ Copper metalization should be used for long electromigration lifetime and low resistivity<br>♦ Pre-stressing may be required | ♦ Fischenbeck, U.S. Pat. No. 4,032,929<br>♦ IJ25 |
| Surface tension reduction | Ink under positive pressure is held in a nozzle by surface tension. The surface tension of the ink is reduced below the bubble threshold, causing the ink to egress from the nozzle. | ♦ Low power consumption<br>♦ Simple construction<br>♦ No unusual materials required in fabrication<br>♦ High efficiency<br>♦ Easy extension from single nozzles to pagewidth print heads | ♦ Requires supplementary force to effect drop separation<br>♦ Requires special ink surfactants<br>♦ Speed may be limited by surfactant properties | ♦ Silverbrook, EP 0771 658 A2 and related patent applications |
| Viscosity reduction | The ink viscosity is locally reduced to select which drops are to be ejected. A viscosity reduction can be achieved electro-thermally with most inks, but special inks can be engineered for a 100:1 viscosity reduction. | ♦ Simple construction<br>♦ No unusual materials required in fabrication<br>♦ Easy extension from single nozzles to pagewidth print heads | ♦ Requires supplementary force to effect drop separation<br>♦ Requires special ink viscosity properties<br>♦ High speed is difficult to achieve<br>♦ Requires oscillating ink pressure<br>♦ A high temperature difference (typically 80 degrees) is required | ♦ Silverbrook, EP 0771 658 A2 and related patent applications |
| Acoustic | An acoustic wave is generated and focussed upon the drop ejection region. | ♦ Can operate without a nozzle plate | ♦ Complex drive circuitry<br>♦ Complex fabrication<br>♦ Low efficiency<br>♦ Poor control of drop position<br>♦ Poor control of drop volume | ♦ 1993 Hadimioglu et al, EUP 550,192<br>♦ 1993 Elrod et al, EUP 572,220 |
| Thermo-elastic bend actuator | An actuator which relies upon differential thermal expansion upon Joule heating is used. | ♦ Low power consumption<br>♦ Many ink types can be used<br>♦ Simple planar fabrication<br>♦ Small chip area required for each actuator<br>♦ Fast operation<br>♦ High efficiency<br>♦ CMOS compatible voltages and currents<br>♦ Standard MEMS processes can be used<br>♦ Easy extension from single nozzles to pagewidth print | ♦ Efficient aqueous operation requires a thermal insulator on the hot side<br>♦ Corrosion prevention can be difficult<br>♦ Pigmented inks may be infeasible, as pigment particles may jam the bend actuator | ♦ IJ03, IJ09, IJ17, IJ18, IJ19, IJ20, IJ21, IJ22, IJ23, IJ24, IJ27, IJ28, IJ29, IJ30, IJ31, IJ32, IJ33, IJ34, IJ35, IJ36, IJ37, IJ38, IJ39, IJ40, IJ41 |

-continued

| | Description | Advantages | Disadvantages | Examples |
|---|---|---|---|---|
| High CTE thermo-elastic actuator | A material with a very high coefficient of thermal expansion (CTE) such as polytetrafluoroethylene (PTFE) is used. As high CTE materials are usually non-conductive, a heater fabricated from a conductive material is incorporated. A 50 μm long PTFE bend actuator with polysilicon heater and 15 mW power input can provide 180 μN force and 10 μm deflection. Actuator motions include:<br>Bend<br>Push<br>Buckle<br>Rotate | heads<br>♦ High force can be generated<br>♦ Three methods of PTFE deposition are under development: chemical vapor deposition (CVD), spin coating, and evaporation<br>♦ PTFE is a candidate for low dielectric constant insulation in ULSI<br>♦ Very low power consumption<br>♦ Many ink types can be used<br>♦ Simple planar fabrication<br>♦ Small chip area required for each actuator<br>♦ Fast operation<br>♦ High efficiency<br>♦ CMOS compatible voltages and currents<br>♦ Easy extension from single nozzles to pagewidth print heads | ♦ Requires special material (e.g. PTFE)<br>♦ Requires a PTFE deposition process, which is not yet standard in ULSI fabs<br>♦ PTFE deposition cannot be followed with high temperature (above 350° C.) processing<br>♦ Pigmented inks may be infeasible, as pigment particles may jam the bend actuator | ♦ IJ09, IJ17, IJ18, IJ20, IJ21, IJ22, IJ23, IJ24, IJ27, IJ28, IJ29, IJ30, IJ31, IJ42, IJ43, IJ44 |
| Conductive polymer thermo-elastic actuator | A polymer with a high coefficient of thermal expansion (such as PTFE) is doped with conducting substances to increase its conductivity to about 3 orders of magnitude below that of copper. The conducting polymer expands when resistively heated. Examples of conducting dopants include:<br>Carbon nanotubes<br>Metal fibers<br>Conductive polymers such as doped polythiophene<br>Carbon granules | ♦ High force can be generated<br>♦ Very low power consumption<br>♦ Many ink types can be used<br>♦ Simple planar fabrication<br>♦ Small chip area required for each actuator<br>♦ Fast operation<br>♦ High efficiency<br>♦ CMOS compatible voltages and currents<br>♦ Easy extension from single nozzles to pagewidth print heads | ♦ Requires special materials development (High CTE conductive polymer)<br>♦ Requires a PTFE deposition process, which is not yet standard in ULSI fabs<br>♦ PTFE deposition cannot be followed with high temperature (above 350° C.) processing<br>♦ Evaporation and CVD deposition techniques cannot be used<br>♦ Pigmented inks may be infeasible, as pigment particles may jam the bend actuator | ♦ IJ24 |
| Shape memory alloy | A shape memory alloy such as TiNi (also known as Nitinol Nickel Titanium alloy developed at the Naval Ordnance Laboratory) is thermally switched between its weak martensitic state and its high stiffness austenic state. The shape of the actuator in its martensitic state is deformed relative to the austenic shape. The shape change causes ejection of a drop. | ♦ High force is available (stresses of hundreds of MPa)<br>♦ Large strain is available (more than 3%)<br>♦ High corrosion resistance<br>♦ Simple construction<br>♦ Easy extension from single nozzles to pagewidth print heads<br>♦ Low voltage operation | ♦ Fatigue limits maximum number of cycles<br>♦ Low strain (1%) is required to extend fatigue resistance<br>♦ Cycle rate limited by heat removal<br>♦ Requires unusual materials (TiNi)<br>♦ The latent heat of transformation must be provided<br>♦ High current operation<br>♦ Requires prestressing to distort the martensitic state | ♦ IJ26 |
| Linear Magnetic Actuator | Linear magnetic actuators include the Linear Induction Actuator (LIA), Linear | ♦ Linear Magnetic actuators can be constructed with high thrust, long | ♦ Requires unusual semiconductor materials such as soft magnetic alloys | ♦ IJ12 |

-continued

| | Description | Advantages | Disadvantages | Examples |
|---|---|---|---|---|
| | Permanent Magnet Synchronous Actuator (LPMSA), Linear Reluctance Synchronous Actuator (LRSA), Linear Switched Reluctance Actuator (LSRA), and the Linear Stepper Actuator (LSA). | travel, and high efficiency using planar semiconductor fabrication techniques<br>♦ Long actuator travel is available<br>♦ Medium force is available<br>♦ Low voltage operation | (e.g. CoNiFe)<br>♦ Some varieties also require permanent magnetic materials such as Neodymium iron boron (NdFeB)<br>♦ Requires complex multiphase drive circuitry<br>♦ High current operation | |

BASIC OPERATION MODE

| | Description | Advantages | Disadvantages | Examples |
|---|---|---|---|---|
| Actuator directly pushes ink | This is the simplest mode of operation: the actuator directly supplies sufficient kinetic energy to expel the drop. The drop must have a sufficient velocity to overcome the surface tension. | ♦ Simple operation<br>♦ No external fields required<br>♦ Satellite drops can be avoided if drop velocity is less than 4 m/s<br>♦ Can be efficient, depending upon the actuator used | ♦ Drop repetition rate is usually limited to around 10 kHz. However, this is not fundamental to the method, but is related to the refill method normally used<br>♦ All of the drop kinetic energy must be provided by the actuator<br>♦ Satellite drops usually form if drop velocity is greater than 4.5 m/s | ♦ Thermal ink jet<br>♦ Piezoelectric ink jet<br>♦ IJ01, IJ02, IJ03, IJ04, IJ05, IJ06, IJ07, IJ09, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Proximity | The drops to be printed are selected by some manner (e.g. thermally induced surface tension reduction of pressurized ink). Selected drops are separated from the ink in the nozzle by contact with the print medium or a transfer roller. | ♦ Very simple print head fabrication can be used<br>♦ The drop selection means does not need to provide the energy required to separate the drop from the nozzle | ♦ Requires close proximity between the print head and the print media or transfer roller<br>♦ May require two print heads printing alternate rows of the image<br>♦ Monolithic color print heads are difficult | ♦ Silverbrook, EP 0771 658 A2 and related patent application |
| Electro-static pull on ink | The drops to be printed are selected by some manner (e.g. thermally induced surface tension reduction of pressurized ink). Selected drops are separated from the ink in the nozzle by a strong electric field. | ♦ Very simple print head fabrication can be used<br>♦ The drop selection means does not need to provide the energy required to separate the drop from the nozzle | ♦ Requires very high electrostatic field<br>♦ Electrostatic field for small nozzle sizes is above air breakdown<br>♦ Electrostatic field may attract dust | ♦ Silverbrook, EP 0771 658 A2 and related patent applications<br>♦ Tone-Jet |
| Magnetic pull on ink | The drops to be printed are selected by some manner (e.g. thermally induced surface tension reduction of pressurized ink). Selected drops are separated from the ink in the nozzle by a strong magnetic field acting on the magnetic ink. | ♦ Very simple print head fabrication can be used<br>♦ The drop selection means does not need to provide the energy required to separate the drop from the nozzle | ♦ Requires magnetic ink<br>♦ Ink colors other than black are difficult<br>♦ Requires very high magnetic fields | ♦ Silverbrook, EP 0771 658 A2 and related patent applications |
| Shutter | The actuator moves a shutter to block ink flow to the nozzle. The ink pressure is pulsed at a multiple of the drop ejection frequency. | ♦ High speed (>50 kHz) operation can be achieved due to reduced refill time<br>♦ Drop timing can be very accurate<br>♦ The actuator energy can be very low | ♦ Moving parts are required<br>♦ Requires ink pressure modulator<br>♦ Friction and wear must be considered<br>♦ Stiction is possible | ♦ IJ13, IJ17, IJ21 |

-continued

| | Description | Advantages | Disadvantages | Examples |
|---|---|---|---|---|
| Shuttered grill | The actuator moves a shutter to block ink flow through a grill to the nozzle. The shutter movement need only be equal to the width of the grill holes. | ◆ Actuators with small travel can be used<br>◆ Actuators with small force can be used<br>◆ High speed (>50 kHz) operation can be achieved | ◆ Moving parts are required<br>◆ Requires ink pressure modulator<br>◆ Friction and wear must be considered<br>◆ Stiction is possible | ◆ IJ08, IJ15, IJ18, IJ19 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | ◆ Extremely low energy operation is possible<br>◆ No heat dissipation problems | ◆ Requires an external pulsed magnetic field<br>◆ Requires special materials for both the actuator and the ink pusher<br>◆ Complex construction | ◆ IJ10 |
| | | AUXILIARY MECHANISM (APPLIED TO ALL NOZZLES) | | |
| None | The actuator directly fires the ink drop, and there is no external field or other mechanism required. | ◆ Simplicity of construction<br>◆ Simplicity of operation<br>◆ Small physical size | ◆ Drop ejection energy must be supplied by individual nozzle actuator | ◆ Most ink jets, including piezoelectric and thermal bubble.<br>◆ IJ01, IJ02, IJ03, IJ04, IJ05, IJ07, IJ09, IJ11, IJ12, IJ14, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Oscillating ink pressure (including acoustic stimulation) | The ink pressure oscillates, providing much of the drop ejection energy. The actuator selects which drops are to be fired by selectively blocking or enabling nozzles. The ink pressure oscillation may be achieved by vibrating the print head, or preferably by an actuator in the ink supply. | ◆ Oscillating ink pressure can provide a refill pulse, allowing higher operating speed<br>◆ The actuators may operate with much lower energy<br>◆ Acoustic lenses can be used to focus the sound on the nozzles | ◆ Requires external ink pressure oscillator<br>◆ Ink pressure phase and amplitude must be carefully controlled<br>◆ Acoustic reflections in the ink chamber must be designed for | ◆ Silverbrook, EP 0771 658 A2 and related patent applications<br>◆ IJ08, IJ13, IJ15, IJ17, IJ18, IJ19, IJ21 |
| Media proximity | The print head is placed in close proximity to the print medium. Selected drops protrude from the print head further than unselected drops, and contact the print medium. The drop soaks into the medium fast enough to cause drop separation. | ◆ Low power<br>◆ High accuracy<br>◆ Simple print head construction | ◆ Precision assembly required<br>◆ Paper fibers may cause problems<br>◆ Cannot print on rough substrates | ◆ Silverbrook, EP 0771 658 A2 and related patent applications |
| Transfer roller | Drops are printed to a transfer roller instead of straight to the print medium. A transfer roller can also be used for proximity drop separation. | ◆ High accuracy<br>◆ Wide range of print substrates can be used<br>◆ Ink can be dried on the transfer roller | ◆ Bulky<br>◆ Expensive<br>◆ Complex construction | ◆ Silverbrook, EP 0771 658 A2 and related patent applications<br>◆ Tektronix hot melt piezoelectric ink jet<br>◆ Any of the IJ series |
| Electrostatic | An electric field is used to accelerate selected drops towards the print medium. | ◆ Low power<br>◆ Simple print head construction | ◆ Field strength required for separation of small drops is near or above air breakdown | ◆ Silverbrook, EP 0771 658 A2 and related patent applications<br>◆ Tone-Jet |
| Direct | A magnetic field is | ◆ Low power | ◆ Requires | ◆ Silverbrook, EP |

-continued

|  | Description | Advantages | Disadvantages | Examples |
|---|---|---|---|---|
| magnetic field | used to accelerate selected drops of magnetic ink towards the print medium. | ◆ Simple print head construction | ◆ magnetic ink<br>◆ Requires strong magnetic field | 0771 658 A2 and related patent applications |
| Cross magnetic field | The print head is placed in a constant magnetic field. The Lorenz force in a current carrying wire is used to move the actuator. | ◆ Does not require magnetic materials to be integrated in the print head manufacturing process | ◆ Requires external magnet<br>◆ Current densities may be high, resulting in electromigration problems | ◆ IJ06, IJ16 |
| Pulsed magnetic field | A pulsed magnetic field is used to cyclically attract a paddle, which pushes on the ink. A small actuator moves a catch, which selectively prevents the paddle from moving | ◆ Very low power operation is possible<br>◆ Small print head size | ◆ Complex print head construction<br>◆ Magnetic materials required in print head | ◆ IJ10 |
| ACTUATOR AMPLIFICATION OR MODIFICATION METHOD ||||| 
| None | No actuator mechanical amplification is used. The actuator directly drives the drop ejection process. | ◆ Operational simplicity | ◆ Many actuator mechanisms have insufficient travel, or insufficient force, to efficiently drive the drop ejection process | ◆ Thermal Bubble Ink jet<br>◆ IJ01, IJ02, IJ06, IJ07, IJ16, IJ25, IJ26 |
| Differential expansion bend actuator | An actuator material expands more on one side than on the other. The expansion may be thermal, piezoelectric, magnetostrictive, or other mechanism. The bend actuator converts a high force low travel actuator mechanism to high travel, lower force mechanism. | ◆ Provides greater travel in a reduced print head area | ◆ High stresses are involved<br>◆ Care must be taken that the materials do not delaminate<br>◆ Residual bend resulting from high temperature or high stress during formation | ◆ Piezoelectric<br>◆ IJ03, IJ09, IJ17, IJ18, IJ19, IJ20, IJ21, IJ22, IJ23, IJ24, IJ27, IJ29, IJ30, IJ31, IJ32, IJ33, IJ34, IJ35, IJ36, IJ37, IJ38, IJ39, IJ42, IJ43, IJ44 |
| Transient bend actuator | A trilayer bend actuator where the two outside layers are identical. This cancels bend due to ambient temperature and residual stress. The actuator only responds to transient heating of one side or the other. | ◆ Very good temperature stability<br>◆ High speed, as a new drop can be fired before heat dissipates<br>◆ Cancels residual stress of formation | ◆ High stresses are involved<br>◆ Care must be taken that the materials do not delaminate | ◆ IJ40, IJ41 |
| Reverse spring | The actuator loads a spring. When the actuator is turned off, the spring releases. This can reverse the force/distance curve of the actuator to make it compatible with the force/time requirements of the drop ejection. | ◆ Better coupling to the ink | ◆ Fabrication complexity<br>◆ High stress in the spring | ◆ IJ05, IJ11 |
| Actuator stack | A series of thin actuators are stacked. This can be appropriate where actuators require high electric field strength, such as electrostatic and piezoelectric actuators. | ◆ Increased travel<br>◆ Reduced drive voltage | ◆ Increased fabrication complexity<br>◆ Increased possibility of short circuits due to pinholes | ◆ Some piezoelectric ink jets<br>◆ IJ04 |
| Multiple actuators | Multiple smaller actuators are used simultaneously to move the ink. Each actuator need provide only a portion of the force required. | ◆ Increases the force available from an actuator<br>◆ Multiple actuators can be positioned to control ink flow accurately | ◆ Actuator forces may not add linearly, reducing efficiency | ◆ IJ12, IJ13, IJ18, IJ20, IJ22, IJ28, IJ42, IJ43 |
| Linear | A linear spring is used | ◆ Matches low | ◆ Requires print | ◆ IJ15 |

-continued

|  | Description | Advantages | Disadvantages | Examples |
|---|---|---|---|---|
| Spring | to transform a motion with small travel and high force into a longer travel, lower force motion. | travel actuator with higher travel requirements<br>◆ Non-contact method of motion transformation | head area for the spring |  |
| Coiled actuator | A bend actuator is coiled to provide greater travel in a reduced chip area. | ◆ Increases travel<br>◆ Reduces chip area<br>◆ Planar implementations are relatively easy to fabricate. | ◆ Generally restricted to planar implementations due to extreme fabrication difficulty in other orientations. | ◆ IJ17, IJ21, IJ34, IJ35 |
| Flexure bend actuator | A bend actuator has a small region near the fixture point, which flexes much more readily than the remainder of the actuator. The actuator flexing is effectively converted from an even coiling to an angular bend, resulting in greater travel of the actuator tip. | ◆ Simple means of increasing travel of a bend actuator | ◆ Care must be taken not to exceed the elastic limit in the flexure area<br>◆ Stress distribution is very uneven<br>◆ Difficult to accurately model with finite element analysis | ◆ IJ10, IJ19, IJ33 |
| Catch | The actuator controls a small catch. The catch either enables or disables movement of an ink pusher that is controlled in a bulk manner. | ◆ Very low actuator energy<br>◆ Very small actuator size | ◆ Complex construction<br>◆ Requires external force<br>◆ Unsuitable for pigmented inks | ◆ IJ10 |
| Gears | Gears can be used to increase travel at the expense of duration. Circular gears, rack and pinion, ratchets, and other gearing methods can be used. | ◆ Low force, low travel actuators can be used<br>◆ Can be fabricated using standard surface MEMS processes | ◆ Moving parts are required<br>◆ Several actuator cycles are required<br>◆ More complex drive electronics<br>◆ Complex construction<br>◆ Friction, friction, and wear are possible | ◆ IJ13 |
| Buckle plate | A buckle plate can be used to change a slow actuator into a fast motion. It can also convert a high force, low travel actuator into a high travel, medium force motion. | ◆ Very fast movement achievable | ◆ Must stay within elastic limits of the materials for long device life<br>◆ High stresses involved<br>◆ Generally high power requirement | ◆ S. Hirata et al, "An Ink-jet Head Using Diaphragm Microactuator", Proc. IEEE MEMS, Feb. 1996, pp 418–423.<br>◆ IJ18, IJ27 |
| Tapered magnetic pole | A tapered magnetic pole can increase travel at the expense of force. | ◆ Linearizes the magnetic force/distance curve | ◆ Complex construction | ◆ IJ14 |
| Lever | A lever and fulcrum is used to transform a motion with small travel and high force into a motion with longer travel and lower force. The lever can also reverse the direction of travel. | ◆ Matches low travel actuator with higher travel requirements<br>◆ Fulcrum area has no linear movement, and can be used for a fluid seal | ◆ High stress around the fulcrum | ◆ IJ32, IJ36, IJ37 |
| Rotary impeller | The actuator is connected to a rotary impeller. A small angular deflection of the actuator results in a rotation of the impeller vanes, which push the ink against stationary vanes and out of the nozzle. | ◆ High mechanical advantage<br>◆ The ratio of force to travel of the actuator can be matched to the nozzle requirements by varying the number of impeller vanes | ◆ Complex construction<br>◆ Unsuitable for pigmented inks | ◆ IJ28 |
| Acoustic lens | A refractive or diffractive (e.g. zone plate) acoustic lens is | ◆ No moving parts | ◆ Large area required<br>◆ Only relevant for acoustic ink jets | ◆ 1993 Hadimioglu et al, EUP 550,192<br>◆ 1993 Elrod et al, |

-continued

| | Description | Advantages | Disadvantages | Examples |
|---|---|---|---|---|
| Sharp conductive point | used to concentrate sound waves. A sharp point is used to concentrate an electrostatic field. | ◆ Simple construction | ◆ Difficult to fabricate using standard VLSI processes for a surface ejecting ink-jet<br>◆ Only relevant for electrostatic ink jets | EUP 572,220<br>◆ Tone-jet |

ACTUATOR MOTION

| | Description | Advantages | Disadvantages | Examples |
|---|---|---|---|---|
| Volume expansion | The volume of the actuator changes, pushing the ink in all directions. | ◆ Simple construction in the case of thermal ink jet | ◆ High energy is typically required to achieve volume expansion. This leads to thermal stress, cavitation, and kogation in thermal ink jet implementations | ◆ Hewlett-Packard Thermal Ink jet<br>◆ Canon Bubblejet |
| Linear, normal to chip surface | The actuator moves in a direction normal to the print head surface. The nozzle is typically in the line of movement. | ◆ Efficient coupling to ink drops ejected normal to the surface | ◆ High fabrication complexity may be required to achieve perpendicular motion | ◆ IJ01, IJ02, IJ04, IJ07, IJ11, IJ14 |
| Parallel to chip surface | The actuator moves parallel to the print head surface. Drop ejection may still be normal to the surface. | ◆ Suitable for planar fabrication | ◆ Fabrication complexity<br>◆ Function<br>◆ Stiction | ◆ IJ12, IJ13, IJ15, IJ33, IJ34, IJ35, IJ36 |
| Membrane push | An actuator with a high force but small area is used to push a stiff membrane that is in contact with the ink. | ◆ The effective area of the actuator becomes the membrane area | ◆ Fabrication complexity<br>◆ Actuator size<br>◆ Difficulty of integration in a VLSI process | ◆ 1982 Howkins U.S. Pat. No. 4,459,601 |
| Rotary | The actuator causes the rotation of some element, such a grill or impeller | ◆ Rotary levers may be used to increase travel<br>◆ Small chip area requirements | ◆ Device complexity<br>◆ May have friction at a pivot point | ◆ IJ05, IJ08, IJ13, IJ28 |
| Bend | The actuator bends when energized. This may be due to differential thermal expansion, piezoelectric expansion, magnetostriction, or other form of relative dimensional change. | ◆ A very small change in dimensions can be converted to a large motion. | ◆ Requires the actuator to be made from at least two distinct layers, or to have a thermal difference across the actuator | ◆ 1970 Kyser et al U.S. Pat. No. 3,946,398<br>◆ 1973 Stemme U.S. Pat. No. 3,747,120<br>◆ IJ03, IJ09, IJ10, IJ19, IJ23, IJ24, IJ25, IJ29, IJ30, IJ31, IJ33, IJ34, IJ35 |
| Swivel | The actuator swivels around a central pivot. This motion is suitable where there are opposite forces applied to opposite sides of the paddle, e.g. Lorenz force. | ◆ Allows operation where the net linear force on the paddle is zero<br>◆ Small chip area requirements | ◆ Inefficient coupling to the ink motion | ◆ IJ06 |
| Straighten | The actuator is normally bent, and straightens when energized. | ◆ Can be used with shape memory alloys where the austenic phase is planar | ◆ Requires careful balance of stresses to ensure that the quiescent bend is accurate | ◆ IJ26, IJ32 |
| Double bend | The actuator bends in one direction when one element is energized, and bends the other way when another element is energized. | ◆ One actuator can be used to power two nozzles.<br>◆ Reduced chip size.<br>◆ Not sensitive to ambient temperature | ◆ Difficult to make the drops ejected by both bend directions identical.<br>◆ A small efficiency loss compared to equivalent single bend actuators. | ◆ IJ36, IJ37, IJ38 |
| Shear | Energizing the actuator causes a shear | ◆ Can increase the effective travel of | ◆ Not readily applicable to other | ◆ 1985 Fishbeck U.S. Pat. No. 4,584,590 |

-continued

| | Description | Advantages | Disadvantages | Examples |
|---|---|---|---|---|
| Radial constriction | motion in the actuator material. The actuator squeezes an ink reservoir, forcing ink from a constricted nozzle. | piezoelectric actuators<br>◆ Relatively easy to fabricate single nozzles from glass tubing as macroscopic structures | actuator mechanisms<br>◆ High force required<br>◆ Inefficient<br>◆ Difficult to integrate with VLSI processes | ◆ 1970 Zoltan U.S. Pat. No. 3,683,212 |
| Coil/uncoil | A coiled actuator uncoils or coils more tightly. The motion of the free end of the actuator ejects the ink. | ◆ Easy to fabricate as a planar VLSI process<br>◆ Small area required, therefore low cost | ◆ Difficult to fabricate for non-planar devices<br>◆ Poor out-of-plane stiffness | ◆ IJ17, IJ21, IJ34, IJ35 |
| Bow | The actuator bows (or buckles) in the middle when energized. | ◆ Can increase the speed of travel<br>◆ Mechanically rigid | ◆ Maximum travel is constrained<br>◆ High force required | ◆ IJ16, IJ18, IJ27 |
| Push-Pull | Two actuators control a shutter. One actuator pulls the shutter, and the other pushes it. | ◆ The structure is primed at both ends, so has a high out-of-plane rigidity | ◆ Not readily suitable for ink jets which directly push the ink | ◆ IJ18 |
| Curl inwards | A set of actuators curl inwards to reduce the volume of ink that they enclose. | ◆ Good fluid flow to the region behind the actuator increases efficiency | ◆ Design complexity | ◆ IJ20, IJ42 |
| Curl outwards | A set of actuators curl outwards, pressurizing ink in a chamber surrounding the actuators, and expelling ink from a nozzle in the chamber. | ◆ Relatively simple construction | ◆ Relatively large chip area | ◆ IJ43 |
| Iris | Multiple vanes enclose a volume of ink. These simultaneously rotate, reducing the volume between the vanes | ◆ High efficiency<br>◆ Small chip area | ◆ High fabrication complexity<br>◆ Not suitable for pigmented inks | ◆ IJ22 |
| Acoustic vibration | The actuator vibrates at a high frequency. | ◆ The actuator can be physically distant from the ink | ◆ Large area required for efficient operation at useful frequencies<br>◆ Acoustic coupling and crosstalk<br>◆ Complex drive circuitry<br>◆ Poor control of drop volume and position | ◆ 1993 Hadimioglu et al, EUP 550,192<br>◆ 1993 Elrod et al, EUP 572,220 |
| None | In various ink jet designs the actuator does not move. | ◆ No moving parts | ◆ Various other tradeoffs are required to eliminate moving parts | ◆ Silverbrook, EP 0771 658 A2 and related patent applications<br>◆ Tone-jet |

NOZZLE REFILL METHOD

| | Description | Advantages | Disadvantages | Examples |
|---|---|---|---|---|
| Surface tension | This is the normal way that ink jets are refilled. After the actuator is energized, it typically returns rapidly to its normal position. This rapid return sucks in air through the nozzle opening. The ink surface tension at the nozzle then exerts a small force restoring the meniscus to a minimum area. This force refills the nozzle. | ◆ Fabrication simplicity<br>◆ Operational simplicity | ◆ Low speed<br>◆ Surface tension force relatively small compared to actuator force<br>◆ Long refill time usually dominates the total repetition rate | ◆ Thermal ink jet<br>◆ Piezoelectric ink jet<br>◆ IJ01–IJ07, IJ10–IJ14, IJ16, IJ20, IJ22–IJ45 |
| Shuttered oscillating ink pressure | Ink to the nozzle chamber is provided at a pressure that oscillates at twice the drop ejection frequency. When a | ◆ High speed<br>◆ Low actuator energy, as the actuator need only open or close the shutter, instead of | ◆ Requires common ink pressure oscillator<br>◆ May not be suitable for pigmented inks | ◆ IJ08, IJ13, IJ15, IJ17, IJ18, IJ19, IJ21 |

-continued

| | Description | Advantages | Disadvantages | Examples |
|---|---|---|---|---|
| | drop is to be ejected, the shutter is opened for 3 half cycles: drop ejection, actuator return, and refill. The shutter is then closed to prevent the nozzle chamber emptying during the next negative pressure cycle. | ejecting the ink drop | | |
| Refill actuator | After the main actuator has ejected a drop a second (refill) actuator is energized. The refill actuator pushes ink into the nozzle chamber. The refill actuator returns slowly, to prevent its return from emptying the chamber again. | ◆ High speed, as the nozzle is actively refilled | ◆ Requires two independent actuators per nozzle | ◆ IJ09 |
| Positive ink pressure | The ink is held a slight positive pressure. After the ink drop is ejected, the nozzle chamber fills quickly as surface tension and ink pressure both operate to refill the nozzle. | ◆ High refill rate, therefore a high drop repetition rate is possible | ◆ Surface spill must be prevented<br>◆ Highly hydrophobic print head surfaces are required | ◆ Silverbrook, EP 0771 658 A2 and related patent applications<br>◆ Alterative for:, IJ01–IJ07, IJ10–IJ14, IJ16, IJ20, IJ22–IJ45 |

METHOD OF RESTRICTING BACK-FLOW THROUGH INLET

| | Description | Advantages | Disadvantages | Examples |
|---|---|---|---|---|
| Long inlet channel | The ink inlet channel to the nozzle chamber is made long and relatively narrow, relying on viscous drag to reduce inlet back-flow. | ◆ Design simplicity<br>◆ Operational simplicity<br>◆ Reduces crosstalk | ◆ Restricts refill rate<br>◆ May result in a relatively large chip area<br>◆ Only partially effective | ◆ Thermal ink jet<br>◆ Piezoelectric ink jet<br>◆ IJ42, IJ43 |
| Positive ink pressure | The ink is under a positive pressure, so that in the quiescent state some of the ink drop already protrudes from the nozzle. This reduces the pressure in the nozzle chamber which is required to eject a certain volume of ink. The reduction in chamber pressure results in a reduction in ink pushed out through the inlet. | ◆ Drop selection and separation forces can be reduced<br>◆ Fast refill time | ◆ Requires a method (such as a nozzle rim or effective hydrophobizing, or both) to prevent flooding of the ejection surface of the print head. | ◆ Silverbrook, EP 0771 658 A2 and related patent applications<br>◆ Possible operation of the following: IJ01–IJ07, IJ09–IJ12, IJ14, IJ16, IJ20, IJ22, IJ23–IJ34, IJ36–IJ41, IJ44 |
| Baffle | One or more baffles are placed in the inlet ink flow. When the actuator is energized, the rapid ink movement creates eddies which restrict the flow through the inlet. The slower refill process is unrestricted, and does not result in eddies. | ◆ The refill rate is not as restricted as the long inlet method.<br>◆ Reduces crosstalk | ◆ Design complexity<br>◆ May increase fabrication complexity (e.g. Tektronix hot melt Piezoelectric print heads). | ◆ HP Thermal Ink Jet<br>◆ Tektronix piezoelectric ink jet |
| Flexible flap restricts inlet | In this method recently disclosed by Canon, the expanding actuator (bubble) pushes on a flexible flap that restricts the inlet. | ◆ Significantly reduces back-flow for edge-shooter thermal ink jet devices | ◆ Not applicable to most ink jet configurations<br>◆ Increased fabrication complexity<br>◆ Inelastic deformation of polymer flap results in creep over extended use | ◆ Canon |
| Inlet filter | A filter is located between the ink inlet | ◆ Additional advantage of ink | ◆ Restricts refill rate | ◆ IJ04, IJ12, IJ24, IJ27, IJ29, IJ30 |

-continued

| | Description | Advantages | Disadvantages | Examples |
|---|---|---|---|---|
| | and the nozzle chamber. The filter has a multitude of small holes or slots, restricting ink flow. The filter also removes particles which may block the nozzle. | filtration<br>♦ Ink filter may be fabricated with no additional process steps | ♦ May result in complex construction | |
| Small inlet compared to nozzle | The ink inlet channel to the nozzle chamber has a substantially smaller cross section than that of the nozzle resulting in easier ink egress out of the nozzle than out of the inlet. | ♦ Design simplicity | ♦ Restricts refill rate<br>♦ May result in a relatively large chip area<br>♦ Only partially effective | ♦ IJ02, IJ37, IJ44 |
| Inlet shutter | A secondary actuator controls the position of a shutter, closing off the ink inlet when the main actuator is energized. | ♦ Increases speed of the ink-jet print head operation | ♦ Requires separate refill actuator and drive circuit | ♦ IJ09 |
| The inlet is located behind the ink-pushing surface | The method avoids the problem of inlet back-flow by arranging the ink-pushing surface of the actuator between the inlet and the nozzle. | ♦ Back-flow problem is eliminated | ♦ Requires careful design to minimize the negative pressure behind the paddle | ♦ IJ01, IJ03, IJ05, IJ06, IJ07, IJ10, IJ11, IJ14, IJ16, IJ22, IJ23, IJ25, IJ28, IJ31, IJ32, IJ33, IJ34, IJ35, IJ36, IJ39, IJ40, IJ41 |
| Part of the actuator moves to shut off the inlet | The actuator and a wall of the ink chamber are arranged so that the motion of the actuator closes off the inlet. | ♦ Significant reductions in back-flow can be achieved<br>♦ Compact designs possible | ♦ Small increase in fabrication complexity | ♦ IJ07, IJ20, IJ26, IJ38 |
| Nozzle actuator does not result in ink back-flow | In some configurations of ink jet, there is no expansion or movement of an actuator which may cause ink back-flow through the inlet. | ♦ Ink back-flow problem is eliminated | ♦ None related to ink back-flow on actuation | ♦ Silverbrook, EP 0771 658 A2 and related patent applications<br>♦ Valve-jet<br>♦ Tone-jet |
| | NOZZLE CLEARING METHOD | | | |
| Normal nozzle firing | All of the nozzles are fired periodically, before the ink has a chance to dry. When not in use the nozzles are sealed (capped) against air.<br>The nozzle firing is usually performed during a special clearing cycle, after first moving the print head to a cleaning station. | ♦ No added complexity on the print head | ♦ May not be sufficient to displace dried ink | ♦ Most ink jet systems<br>♦ IJ01, IJ02, IJ03, IJ04, IJ05, IJ06, IJ07, IJ09, IJ10, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink heater | In systems which heat the ink, but do not boil it under normal situations, nozzle clearing can be achieved by over-powering the heater and boiling ink at the nozzle. | ♦ Can be highly effective if the heater is adjacent to the nozzle | ♦ Requires higher drive voltage for clearing<br>♦ May require larger drive transistors | ♦ Silverbrook, EP 0771 658 A2 and related patent applications |
| Rapid succession of actuator pulses | The actuator is fired in rapid succession. In some configurations, this may cause heat build-up at the nozzle which boils the ink, clearing the nozzle. In | ♦ Does not require extra drive circuits on the print head<br>♦ Can be readily controlled and initiated by digital logic | ♦ Effectiveness depends substantially upon the configuration of the ink jet nozzle | ♦ May be used with: IJ01, IJ02, IJ03, IJ04, IJ05, IJ06, IJ07, IJ09, IJ10, IJ11, IJ14, IJ16, IJ20, IJ22, IJ23, IJ24, IJ25, |

-continued

| | Description | Advantages | Disadvantages | Examples |
|---|---|---|---|---|
| | other situations, it may cause sufficient vibrations to dislodge clogged nozzles. | | | IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink pushing actuator | Where an actuator is not normally driven to the limit of its motion, nozzle clearing may be assisted by providing an enhanced drive signal to the actuator. | ♦ A simple solution where applicable | ♦ Not suitable where there is a hard limit to actuator movement | ♦ May be used with: IJ03, IJ09, IJ16, IJ20, IJ23, IJ24, IJ25, IJ27, IJ29, IJ30, IJ31, IJ32, IJ39, IJ40, IJ41, IJ42, IJ43, IJ44, IJ45 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | ♦ A high nozzle clearing capability can be achieved<br>♦ May be implemented at very low cost in systems which already include acoustic actuators | ♦ High implementation cost if system does not already include an acoustic actuator | ♦ IJ08, IJ13, IJ15, IJ17, IJ18, IJ19, IJ21 |
| Nozzle clearing plate | A microfabricated plate is pushed against the nozzles. The plate has a post for every nozzle. A post moves through each nozzle, displacing dried ink. | ♦ Can clear severely clogged nozzles | ♦ Accurate mechanical alignment is required<br>♦ Moving parts are required<br>♦ There is risk of damage to the nozzles<br>♦ Accurate fabrication is required | ♦ Silverbrook, EP 0771 658 A2 and related patent applications |
| Ink pressure pulse | The pressure of the ink is temporarily increased so that ink streams from all of the nozzles. This may be used in conjunction with actuator energizing. | ♦ May be effective where other methods cannot be used | ♦ Requires pressure pump or other pressure actuator<br>♦ Expensive<br>♦ Wasteful of ink | ♦ May be used with all IJ series ink jets |
| Print head wiper | A flexible 'blade' is wiped across the print head surface. The blade is usually fabricated from a flexible polymer, e.g. rubber or synthetic elastomer. | ♦ Effective for planar print head surfaces<br>♦ Low cost | ♦ Difficult to use if print head surface is non-planar or very fragile<br>♦ Requires mechanical parts<br>♦ Blade can wear out in high volume print systems | ♦ Many ink jet systems |
| Separate ink boiling heater | A separate heater is provided at the nozzle although the normal drop election mechanism does not require it. The heaters do not require individual drive circuits, as many nozzles can be cleared simultaneously, and no imaging is required. | ♦ Can be effective where other nozzle clearing methods cannot be used<br>♦ Can be implemented at no additional cost in some ink jet configurations | ♦ Fabrication complexity | ♦ Can be used with many IJ series ink jets |

NOZZLE PLATE CONSTRUCTION

| | Description | Advantages | Disadvantages | Examples |
|---|---|---|---|---|
| Electro-formed nickel | A nozzle plate is separately fabricated from electroformed nickel, and bonded to the print head chip. | ♦ Fabrication simplicity | ♦ High temperatures and pressures are required to bond nozzle plate<br>♦ Minimum thickness constraints<br>♦ Differential thermal expansion | ♦ Hewlett Packard Thermal Ink jet |
| Laser ablated or drilled | Individual nozzle holes are ablated by an intense UV laser in a | ♦ No masks required<br>♦ Can be quite fast | ♦ Each hole must be individually formed | ♦ Canon Bubblejet<br>♦ 1988 Sercel et al., SPTE, Vol. 998 |

-continued

| | Description | Advantages | Disadvantages | Examples |
|---|---|---|---|---|
| polymer | nozzle plate, which is typically a polymer such as polyimide or polysulphone | ◆ Some control over nozzle profile is possible<br>◆ Equipment required is relatively low cost | ◆ Special equipment required<br>◆ Slow where there are many thousands of nozzles per print head<br>◆ May produce thin burrs at exit holes | Excimer Beam Applications, pp. 76–83<br>◆ 1993 Watanabe et al., U.S. Pat. No. 5,208,604 |
| Silicon micro-machined | A separate nozzle plate is micromachined from single crystal silicon, and bonded to the print head wafer. | ◆ High accuracy is attainable | ◆ Two part construction<br>◆ High cost<br>◆ Requires precision alignment<br>◆ Nozzles may be clogged by adhesive | ◆ K. Bean, IEEE Transactions on Electron Devices, VI. ED-25, No. 10, 1978, pp 1185–1195<br>◆ Xerox 1990 Hawkins et al., U.S. Pat. No. 4,899,181 |
| Glass capillaries | Fine glass capillaries are drawn from glass tubing. This method has been used for making individual nozzles, but is difficult to use for bulk manufacturing of print heads with thousands of nozzles. | ◆ No expensive equipment required<br>◆ Simple to make single nozzles | ◆ Very small nozzle sizes are difficult to form<br>◆ Not suited for mass production | ◆ 1970 Zoltan U.S. Pat. No. 3,683,212 |
| Monolithic, surface micro-machined using VLSI lithographic processes | The nozzle plate is deposited as a layer using standard VLSI deposition techniques. Nozzles are etched in the nozzle late using VLSI lithography and etching. | ◆ High accuracy (<1 μm)<br>◆ Monolithic<br>◆ Low cost<br>◆ Existing processes can be used | ◆ Requires sacrificial layer under the nozzle plate to form the nozzle chamber<br>◆ Surface may be fragile to the touch | ◆ Silverbrook, EP 0771 658 A2 and related patent applications<br>◆ IJ01, IJ02, IJ04, IJ11, IJ12, IJ17, IJ18, IJ20, IJ22, IJ24, IJ27, IJ28, IJ29, IJ30, IJ31, IJ32, IJ33, IJ34, IJ36, IJ37, IJ38, IJ39, IJ40, IJ41, IJ42, IJ43, IJ44 |
| Monolithic, etched through substrate | The nozzle plate is a buried etch stop in the wafer. Nozzle chambers are etched in the front of the wafer, and the wafer is thinned from the back side. Nozzles are then etched in the etch stop layer. | ◆ High accuracy (<1 μm)<br>◆ Monolithic<br>◆ Low cost<br>◆ No differential expansion | ◆ Requires long etch times<br>◆ Requires a support wafer | ◆ IJ03, IJ05, IJ06, IJ07, IJ08, IJ09, IJ10, IJ13, IJ14, IJ15, IJ16, IJ19, IJ21, IJ23, IJ25, IJ26 |
| No nozzle plate | Various methods have been tried to eliminate the nozzles entirely, to prevent nozzle clogging. These include thermal bubble mechanisms and acoustic lens mechanisms | ◆ No nozzles to become clogged | ◆ Difficult to control drop position accurately<br>◆ Crosstalk problems | ◆ Ricoh 1995 Sekiya et al U.S. Pat. No. 5,412,413<br>◆ 1993 Hadimioglu et al EUP 550,192<br>◆ 1993 Elrod et al EUP 572,220 |
| Trough | Each drop ejector has a trough through which a paddle moves. There is no nozzle plate. | ◆ Reduced manufacturing complexity<br>◆ Monolithic | ◆ Drop firing direction is sensitive to wicking. | ◆ IJ35 |
| Nozzle slit instead of individual nozzles | The elimination of nozzle holes and replacement by a slit encompassing many actuator positions reduces nozzle clogging, but increases crosstalk due to ink surface waves | ◆ No nozzles to become clogged | ◆ Difficult to control drop position accurately<br>◆ Crosstalk problems | ◆ 1989 Saito et al U.S. Pat. No. 4,799,068 |

DROP EJECTION DIRECTION

| | Description | Advantages | Disadvantages | Examples |
|---|---|---|---|---|
| Edge ('edge shooter') | Ink flow is along the surface of the chip, and ink drops are | ◆ Simple construction<br>◆ No silicon | ◆ Nozzles Limited to edge<br>◆ High resolution | ◆ Canon Bubblejet 1979 Endo et al GB patent 2,007,162 |

-continued

| | Description | Advantages | Disadvantages | Examples |
|---|---|---|---|---|
| | ejected from the chip edge. | etching required<br>◆ Good heat sinking via substrate<br>◆ Mechanically strong<br>◆ Ease of chip handing | is difficult<br>◆ Fast color printing requires one print head per color | ◆ Xerox heater-in-pit 1990 Hawkins et al U.S. Pat. No. 4,899,181<br>◆ Tone-jet |
| Surface ('roof shooter') | Ink flow is along the surface of the chip, and ink drops are ejected from the chip surface, normal to the plane of the chip. | ◆ No bulk silicon etching required<br>◆ Silicon can make an effective heat sink<br>◆ Mechanical strength | ◆ Maximum ink flow is severely restricted | ◆ Hewlett-Packard TIJ 1982 Vaught et al U.S. Pat. No. 4,490,728<br>◆ IJ02, IJ11, IJ12, IJ20, IJ22 |
| Through chip, forward ('up shooter') | Ink flow is through the chip, and ink drops are ejected from the front surface of the chip. | ◆ High ink flow<br>◆ Suitable for pagewidth print heads<br>◆ High nozzle packing density therefore low manufacturing cost | ◆ Requires bulk silicon etching | ◆ Silverbrook, EP 0771 658 A2 and related patent applications<br>◆ IJ04, IJ17, IJ18, IJ24, IJ27–IJ45 |
| Through chip, reverse ('down shooter') | Ink flow is through the chip, and ink drops are ejected from the rear surface of the chip. | ◆ High ink flow<br>◆ Suitable for pagewidth print heads<br>◆ High nozzle packing density therefore low manufacturing cost | ◆ Requires wafer thinning<br>◆ Requires special handling during manufacture | ◆ IJ01, IJ03, IJ05, IJ06, IJ07, IJ08, IJ09, IJ10, IJ13, IJ14, IJ15, IJ16, IJ19, IJ21, IJ23, IJ25, IJ26 |
| Through actuator | Ink flow is through the actuator, which is not fabricated as part of the same substrate as the drive transistors. | ◆ Suitable for piezoelectric print heads | ◆ Pagewidth print heads require several thousand connections to drive circuits<br>◆ Cannot be manufactured in standard CMOS fabs<br>◆ Complex assembly required | ◆ Epson Stylus<br>◆ Tektronix hot melt piezoelectric ink jets |

INK TYPE

| | Description | Advantages | Disadvantages | Examples |
|---|---|---|---|---|
| Aqueous, dye | Water based ink which typically contains: water, dye, surfactant, humectant, and biocide.<br>Modern ink dyes have high water-fastness, light fastness | ◆ Environmentally friendly<br>◆ No odor | ◆ Slow drying<br>◆ Corrosive<br>◆ Bleeds on paper<br>◆ May strikethrough<br>◆ Cockles paper | ◆ Most existing ink jets<br>◆ All IJ series ink jets<br>◆ Silverbrook, EP 0771 658 A2 and related patent applications |
| Aqueous, pigment | Water based ink which typically contains: water, pigment, surfactant, humectant, and biocide.<br>Pigments have an advantage in reduced bleed, wicking and strikethrough. | ◆ Environmentally friendly<br>◆ No odor<br>◆ Reduced bleed<br>◆ Reduced wicking<br>◆ Reduced strikethrough | ◆ Slow drying<br>◆ Corrosive<br>◆ Pigment may clog nozzles<br>◆ Pigment may clog actuator mechanisms<br>◆ Cockles paper | ◆ IJ02, IJ04, IJ21, IJ26, IJ27, IJ30<br>◆ Silverbrook, EP 0771 658 A2 and related patent applications<br>◆ Piezoelectric ink-jets<br>◆ Thermal ink jets (with significant restrictions) |
| Methyl Ethyl Ketone (MEK) | MEK is a highly volatile solvent used for industrial printing on difficult surfaces such as aluminum cans. | ◆ Very fast drying<br>◆ Prints on various substrates such as metals and plastics | ◆ Odorous<br>◆ Flammable | ◆ All IJ series ink jets |
| Alcohol (ethanol, 2-butanol, and others) | Alcohol based inks can be used where the printer must operate at temperatures below the freezing point of water. An example of this is in-camera consumer photographic printing. | ◆ Fast drying<br>◆ Operates at sub-freezing temperatures<br>◆ Reduced paper cockle<br>◆ Low cost | ◆ Slight odor<br>◆ Flammable | ◆ All IJ series ink jets |
| Phase change | The ink is solid at room temperature, and | ◆ No drying time-ink instantly freezes | ◆ High viscosity<br>◆ Printed ink | ◆ Tektronix hot melt piezoelectric |

-continued

| | Description | Advantages | Disadvantages | Examples |
|---|---|---|---|---|
| (hot melt) | is melted in the print head before jetting. Hot melt inks are usually wax based, with a melting point around 80° C. After jetting the ink freezes almost instantly upon contacting the print medium or a transfer roller. | on the print medium<br>◆ Almost any print medium can be used<br>◆ No paper cockle occurs<br>◆ No wicking occurs<br>◆ No bleed occurs<br>◆ No strikethrough occurs | typically has a 'waxy' feel<br>◆ Printed pages may 'block'<br>◆ Ink temperature may be above the curie point of permanent magnets<br>◆ Ink heaters consume power<br>◆ Long warm-up time | ink jets<br>◆ 1989 Nowak U.S. Pat. No. 4,820,346<br>◆ All IJ series ink jets |
| Oil | Oil based inks are extensively used in offset printing. They have advantages in improved characteristics on paper (especially no wicking or cockle). Oil soluble dies and pigments are required. | ◆ High solubility medium for some dyes<br>◆ Does not cockle paper<br>◆ Does not wick through paper | ◆ High viscosity: this is a significant limitation for use in ink jets, which usually require a low viscosity. Some short chain and multi-branched oils have a sufficiently low viscosity.<br>◆ Slow drying | ◆ All IJ series ink jets |
| Micro-emulsion | A microemulsion is a stable, self forming emulsion of oil, water, and surfactant. The characteristic drop size is less than 100 nm, and is determined by the preferred curvature of the surfactant. | ◆ Stops ink bleed<br>◆ High dye solubility<br>◆ Water, oil, and amphiphilic soluble dies can be used<br>◆ Can stabilize pigment suspensions | ◆ Viscosity higher than water<br>◆ Cost is slightly higher than water based ink<br>◆ High surfactant concentration required (around 5%) | ◆ All IJ series ink jets |

I claim:

1. An ink jet nozzle apparatus comprising:

a nozzle chamber having an ink ejection port in one wall of said chamber;

an ink supply source interconnected to said nozzle chamber;

an electrostatic actuator to eject ink from said nozzle chamber via said ink ejection port, said electrostatic actuator comprising a series of conductive parallel plates interleaved with resiliently compressible material layers laid down as thin film between the parallel plates;

means for
producing a potential difference across said plates so as to attract adjacent plates to one another thereby causing said compressible material layers to resiliently yield; and
means for reducing said potential difference such that said compressible material layers return to their quiescent state, thereby resulting in the ejection of ink from said ejection port.

2. An apparatus as claimed in claim 1 wherein said compressible material is sufficiently yielding to result in ink being drawn into said nozzle chamber by means of surface tension effects around said ink ejection port.

3. An ink jet nozzle as claimed in claim 1 wherein said compressible material comprises a material having a high dielectric constant.

4. An ink jet nozzle as claimed in claim 1 wherein said electrostatic actuator comprises planar sandwiched layers that are selectively etched to provide an electrical interconnect to the conductive parallel plates.

5. An ink jet nozzle as claimed in claim 1 wherein groups of said series of said conductive parallel plates are constructed from different materials selectively etched and divided into two groups of different polarities.

6. An ink jet nozzle as claimed in claim 5 wherein plates from each of said group are interconnected to a common conductive portion for the provision of a charge to said conductive plates.

7. An ink jet nozzle as claimed in claim 1 wherein said plates are constructed utilizing chemical vapor deposition techniques.

8. An ink jet nozzle as claimed in claim 1 wherein an outer surface of said nozzle chamber includes a plurality of etchant holes.

9. An ink jet nozzle comprising:

a nozzle chamber having an ink ejection port in one wall of said chamber;

an ink supply source interconnected to said nozzle chamber;

an electrostatic actuator to eject ink from said nozzle chamber via said ink ejection port, said electrostatic actuator comprising a series of conductive parallel plates interleaved with resiliently compressible material layers laid down as thin film between the parallel plates; and control means for producing a potential difference across said plates so that said material layers are resiliently compressed such that, upon deactivation, said electrostatic actuator causes ink to be ejected via said ink ejection port.

* * * * *